(12) United States Patent
Jang

(10) Patent No.: US 12,112,882 B2
(45) Date of Patent: Oct. 8, 2024

(54) MAGNETIC SHIELDING SHEET AND MANUFACTURING METHOD THEREFOR

(71) Applicant: AMOSENSE CO., LTD., Cheonan-si (KR)

(72) Inventor: Kil Jae Jang, Cheonan-si (KR)

(73) Assignee: AMOSENSE CO., LTD., Cheonan-si (KR)

(*) Notice: Subject to any disclaimer, the term of this patent is extended or adjusted under 35 U.S.C. 154(b) by 380 days.

(21) Appl. No.: 17/612,055

(22) PCT Filed: Feb. 19, 2021

(86) PCT No.: PCT/KR2021/002122
§ 371 (c)(1),
(2) Date: Nov. 17, 2021

(87) PCT Pub. No.: WO2021/167398
PCT Pub. Date: Aug. 26, 2021

(65) Prior Publication Data
US 2022/0246348 A1    Aug. 4, 2022

(30) Foreign Application Priority Data

Feb. 20, 2020 (KR) .................. 10-2020-0020820
Feb. 20, 2020 (KR) .................. 10-2020-0020821
Feb. 19, 2021 (KR) .................. 10-2021-0022412

(51) Int. Cl.
*H01F 27/36* (2006.01)
*H01F 41/02* (2006.01)
(Continued)

(52) U.S. Cl.
CPC ......... *H01F 27/36* (2013.01); *H01F 41/0266* (2013.01); *H02J 50/10* (2016.02); *H05K 9/0075* (2013.01)

(58) Field of Classification Search
CPC ...... H01F 27/36; H01F 41/0266; H02J 50/10; H05K 9/0075
(Continued)

(56) References Cited

U.S. PATENT DOCUMENTS

2010/0309080 A1* 12/2010 Minemura ............... H01Q 5/40
343/893
2013/0257362 A1* 10/2013 Lim ........................ H01F 27/29
361/752
(Continued)

FOREIGN PATENT DOCUMENTS

KR    10-1178209 B1    8/2012
KR    10-1643924 B1    7/2016
(Continued)

OTHER PUBLICATIONS

International Search Report issued in PCT/KR2021/002122, dated Jun. 9, 2021, 3 pgs.
(Continued)

*Primary Examiner* — April G Gonzales
(74) *Attorney, Agent, or Firm* — Rothwell, Figg, Ernst & Manbeck, P.C.

(57) ABSTRACT

A magnetic shielding sheet and a manufacturing method therefor are provided. The magnetic shielding sheet according to an embodiment of the present invention, which is placed on one surface of an antenna comprising a hollow part disposed at the center thereof and having a predetermined area and a pattern part surrounding the hollow part, may comprise: a sheet body which is made of a magnetic material so as to be able to shield a magnetic field; and at least one eddy current-reducing pattern part which is formed in the sheet body so as to increase the resistance of the sheet body so that the occurrence of eddy current can be reduced.

16 Claims, 15 Drawing Sheets

(51) Int. Cl.
*H02J 50/10* (2016.01)
*H05K 9/00* (2006.01)

(58) Field of Classification Search
USPC .................................................. 455/575.5
See application file for complete search history.

(56) References Cited

U.S. PATENT DOCUMENTS

| | | | | |
|---|---|---|---|---|
| 2014/0017486 | A1* | 1/2014 | Yoo | B32B 38/0004 |
| | | | | 427/289 |
| 2016/0064814 | A1* | 3/2016 | Jang | H05K 9/0075 |
| | | | | 174/377 |
| 2016/0345474 | A1* | 11/2016 | Oh | H04B 5/79 |
| 2017/0103850 | A1* | 4/2017 | Furiya | H01F 29/12 |
| 2017/0142871 | A1* | 5/2017 | Zhou | H05K 9/0086 |
| 2017/0278619 | A1* | 9/2017 | Lee | H01F 5/00 |
| 2018/0026348 | A1* | 1/2018 | Lee | H01Q 5/371 |
| | | | | 455/575.5 |
| 2018/0286575 | A1* | 10/2018 | Kyeong | H01F 38/14 |
| 2019/0148988 | A1* | 5/2019 | Hwang | H01Q 1/526 |
| | | | | 307/104 |
| 2019/0214180 | A1* | 7/2019 | Yoon | H01F 1/28 |
| 2019/0393727 | A1* | 12/2019 | Yoon | H01F 27/255 |

FOREIGN PATENT DOCUMENTS

| | | |
|---|---|---|
| KR | 20170054914 A | 5/2017 |
| KR | 10-2018-0112354 A | 10/2018 |
| WO | 2018-048281 A1 | 3/2018 |

OTHER PUBLICATIONS

Office Action dated Nov. 8, 2022 of the corresponding Korean Patent Application No. 10-2021-0022412 and machine translation from Global Dossier, 17 pgs.

\* cited by examiner

FIG. 11          120' : 130,140

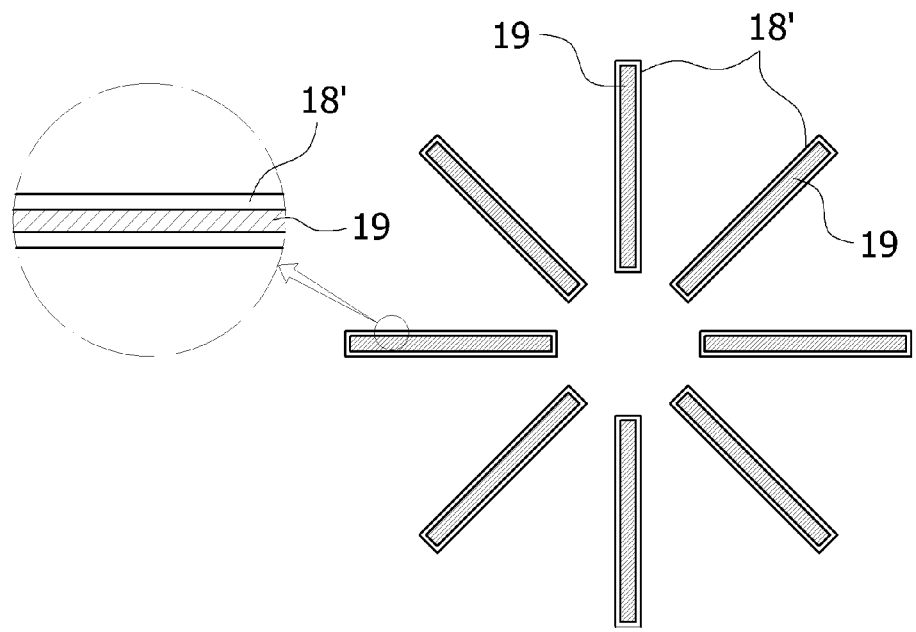
FIG. 21
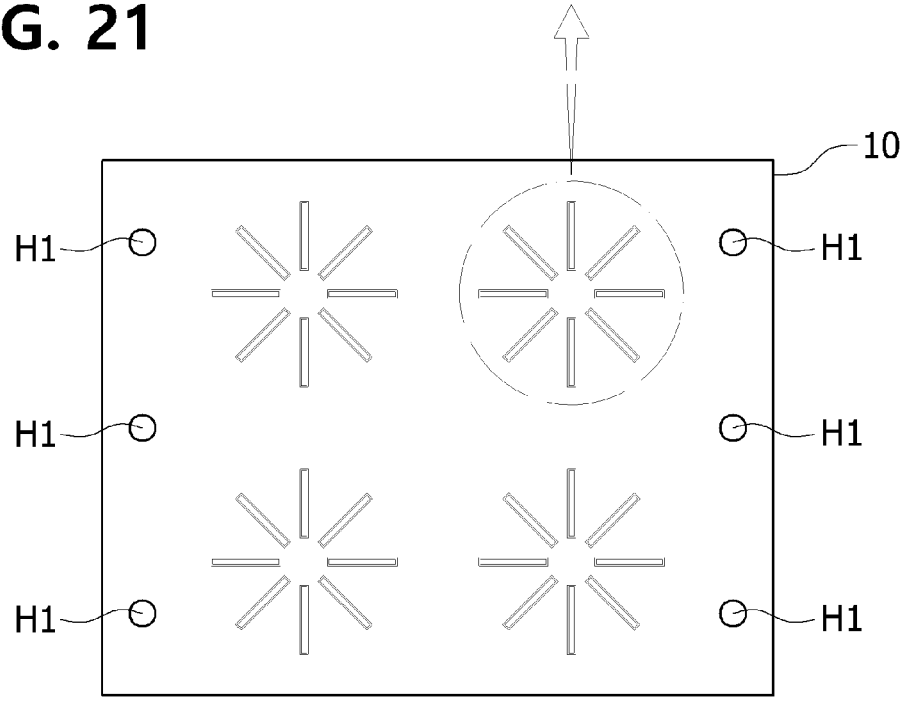

MAGNETIC SHIELDING SHEET AND MANUFACTURING METHOD THEREFOR

CROSS REFERENCE TO RELATED APPLICATIONS

This application is the national phase entry of International Application No. PCT/KR2021/002122, filed on Feb. 19, 2021, designating the United States, which is based upon and claims priority to Korean Patent Application 10-2020-0020820, filed on Feb. 20, 2020, Korean Patent Application 10-2020-0020821, filed on Feb. 20, 2020, and Korean Patent Applications 10-2021-0022412, filed on Feb. 19, 2021, the entire contents of which are incorporated herein by reference.

TECHNICAL FIELD

The present invention relates to a magnetic shielding sheet and a manufacturing method thereof.

BACKGROUND

Near Field Communication (NFC) and wireless charging are essentially non-contact transmission methods. These non-contact transmission methods are realized through an antenna which transmits or receives a magnetic field, and a magnetic shielding sheet disposed on one surface of the antenna to smoothly transmit or receive the magnetic field.

Generally, a sheet made of a magnetic material such as an amorphous ribbon sheet, a ferrite sheet, or a polymer sheet is used as the magnetic shielding sheet.

Meanwhile, a sheet formed to be separated into a plurality of pieces is used as the magnetic shielding sheet to greatly reduce loss due to an eddy current or to improve flexibility of the sheet itself.

As an example, the magnetic shielding sheet may be separated into a plurality of pieces through a flake process. That is, in the flake process, the magnetic shielding sheet can be separated into the plurality of pieces by passing the magnetic shielding sheet between a metal roller provided with a plurality of irregularities or spherical balls on an outer surface and a rubber roller disposed to face the metal roller a plurality of times.

Accordingly, in order to manufacture the magnetic shielding sheet formed to be separated into the plurality of pieces, since a separate flake process for separating the shielding sheet itself into a plurality of pieces is added, there is a problem in that production costs increase.

Further, a magnetic shielding sheet formed to be separated into a plurality of pieces through a conventional flake process can be implemented as a shielding sheet which exhibits uniform characteristics only when the flake process is performed a plurality of times.

However, since sizes of the pieces separated from each other decrease and the total number of separated pieces increases as the flake process is repeatedly performed, the resistance of the shielding sheet can be increased to reduce the effect of the eddy current as the flake process is repeatedly performed, but there is a problem in that the permeability of the shielding sheet falls below 1500.

Accordingly, in order to implement a magnetic shielding sheet having a high permeability of 2000 or more while increasing the resistance of the shielding sheet itself, there is a problem in that an overall thickness of the magnetic shielding sheet should be increased.

SUMMARY OF THE INVENTION

The present invention has been devised in consideration of the above points, and is directed to providing a magnetic shielding sheet capable of realizing a high permeability of 2000 or more while having a very thin thickness by locally forming an eddy current-reducing pattern part in a region corresponding to an antenna among a total area, and a manufacturing method thereof.

Further, the present invention is directed to providing a magnetic shielding sheet capable of locally and selectively forming an eddy current-reducing pattern in a region corresponding to an antenna among a total area even when a separate flake process is not performed, and capable of preventing the generation of burrs or particles in the process of forming an eddy current-reducing pattern, and a manufacturing method thereof.

One aspect of the present invention provides a magnetic shielding sheet disposed on one surface of an antenna including a hollow part having a predetermined area at a center thereof and a pattern part surrounding the hollow part, the magnetic shielding sheet including: a sheet body made of a magnetic material to shield a magnetic field; and at least one eddy current-reducing pattern part formed in the sheet body to increase the resistance of the sheet body so that the occurrence of an eddy current is reduced.

Further, the eddy current-reducing pattern part may be a part of the sheet body formed to be separated into a plurality of pieces by a plurality of cracks at a position corresponding to a region where the pattern part is disposed.

In addition, the remaining part except for the eddy current-reducing pattern part among the sheet body may not be formed separately into a plurality of pieces.

In addition, the eddy current-reducing pattern part may be a part in which a linear area having a predetermined width and length among the sheet body is formed to be separated into a plurality of pieces by a plurality of cracks.

In addition, the sheet body may include a plurality of cracks extending from an edge defining the eddy current-reducing pattern part.

In addition, the eddy current-reducing pattern part may include: a plurality of regular cracks formed in a predetermined shape, and a plurality of irregular cracks derived from the plurality of regular cracks.

In addition, each of the regular cracks may be formed to have one cross-sectional shape among '−', '+', '×', '*', '⊥', and '·'.

In addition, the eddy current-reducing pattern part may be a through part formed in a linear shape having a predetermined width and length to pass through the sheet body.

In addition, the eddy current-reducing pattern part may include a plurality of through parts, and the plurality of through parts may be linearly disposed in one direction to form a dotted line shape to be spaced apart from each other at a predetermined interval.

In addition, the eddy current-reducing pattern part may include a plurality of cracks formed to extend from the through parts.

In addition, a plurality of eddy current-reducing pattern parts may be formed in a region corresponding to the pattern part, and the plurality of eddy current-reducing pattern parts may be radially disposed.

In addition, the magnetic shielding sheet may be a magnetic shielding sheet for a combo antenna unit in which a wireless power transmission antenna and a wireless communication antenna configured to surround the periphery of the wireless power transmission antenna are formed to be patterned on at least one surface of a circuit board, and the eddy current-reducing pattern part may be formed to be located in a region corresponding to the wireless power transmission antenna without being formed in a region corresponding to the wireless communication antenna among a total area of the sheet body.

Meanwhile, another aspect of the present invention provides a method of manufacturing a magnetic shielding sheet disposed on one surface of an antenna including a hollow part having a predetermined area at a center thereof and a pattern part surrounding the hollow part, the method including: a first operation of preparing a plate-shaped magnetic sheet made of a magnetic material and having a first area; and a second operation of applying pressure to a local area of a shielding sheet so that the local area among an inner region of the shielding sheet is separated into a plurality of pieces while being separated from the magnetic sheet into a shielding sheet having a second area which is relatively smaller than the first area.

Further, the second operation may be performed through a mold including cutting blades for processing an edge of the shielding sheet, and at least one pressurizing member disposed inside the cutting blades and provided for pressurizing the local area of the magnetic sheet.

In addition, the pressurizing member may be a crack blade having a shape corresponding to a plurality of regular cracks formed in a predetermined shape on a sheet body to form the regular cracks.

Meanwhile, still another aspect of the present invention provides a method of manufacturing a magnetic shielding sheet disposed on one surface of an antenna including a hollow part having a predetermined area at a center thereof and a pattern part surrounding the hollow part, the method including: a first operation of preparing a plate-shaped magnetic sheet made of a magnetic material and having a first area; an operation of firstly punching a sheet body to form a through part having a predetermined width and length in an inner region of the sheet body and form a plurality of cracks extending from the through part; and an operation of secondarily punching the sheet body to form a shielding sheet including the through part and having a second area which is relatively smaller than the first area.

Further, the operation of firstly punching the sheet body may be performed through a mold including a ring-shaped edge blade for forming an edge of the through part and a separation member formed in an inner region of the edge blade to pressurize and separate a cut piece cut from the sheet body by the edge blade.

In addition, the operation of secondarily punching the sheet body may be an operation of forming an outer edge defining the second area in the sheet body so that the shielding sheet is separated from the sheet body.

According to the present invention, it is possible to reduce the occurrence of an eddy current and realize a high permeability of 2000 or more while having a very thin thickness by increasing the overall resistance through an eddy current-reducing pattern part.

Further, according to the present invention, it is possible to locally and selectively form the eddy current-reducing pattern in a region corresponding to an antenna among a total area even when a separate flake process is not performed, and prevent the generation of burrs or particles in the process of forming an eddy current-reducing pattern to increase a production yield.

BRIEF DESCRIPTION OF THE DRAWINGS

FIG. 21 is a plan view illustrating another shape of an upper mold for first punching applicable to FIG. 20.

DETAILED DESCRIPTION OF THE INVENTION

Figure 1:
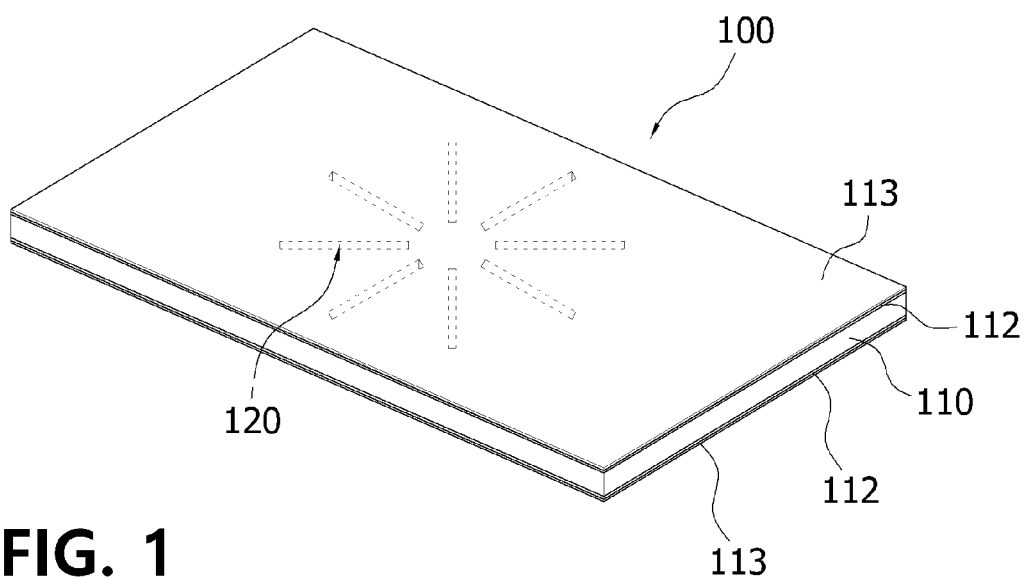
FIG. 1 is a view illustrating a magnetic shielding sheet according to one embodiment of the present invention.

Hereinafter, exemplary embodiments of the present invention will be described in detail with reference to the accompanying drawings which may allow one of ordinary skill in the art to easily carry out the present invention. The present invention may be implemented in various forms and is not limited to the following embodiments. Components not related to the description are not included in the drawings to clearly describe the present invention, and the same reference symbols are used for the same or similar components in the description.

As shown in FIG. 1, a magnetic shielding sheet 100 according to one embodiment of the present invention includes a sheet body 110 and eddy current-reducing pattern parts 120.

The sheet body 110 may be made of a magnetic material to be capable of shielding a magnetic field generated from an antenna unit 200.

Figure 12:
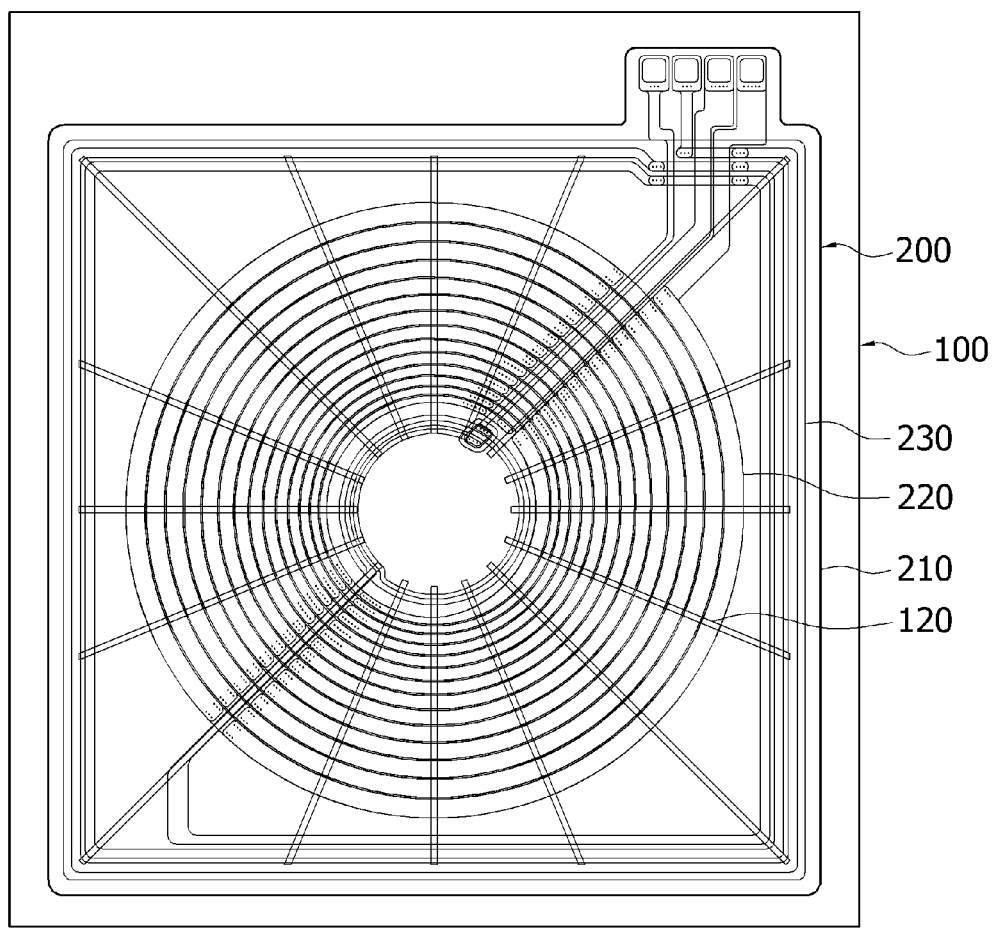
FIG. 12 is a plan view of a wireless power transmission module according to one embodiment of the present invention.

Here, the antenna unit 200 may include at least one antenna 220 or 230 including a hollow part having a predetermined area at a center thereof and a pattern part formed to surround the hollow part with a predetermined number of turns. In this case, the at least one antenna 220 or 230 may be a flat coil in which a conductive member having a predetermined wire diameter is wound a plurality of times, and may also be an antenna pattern patterned on one surface of a circuit board 210 as shown in FIG. 12.

Further, the at least one antenna 220 or 230 may be a wireless power transmission antenna 220 which transmits or receives wireless power, a magnetic secure transmission (MST) antenna for magnetic payment, or a near field communication (NFC) antenna 230 for near field communication. In addition, the antenna unit 200 may be configured as a combo type including two or more among the above-described wireless power transmission antenna 220, MST antenna, and NFC antenna 230.

In this case, the sheet body 110 may be formed of a material including a metal component.

As an example, the sheet body 110 may be a ribbon sheet including at least one of an amorphous alloy and a nano-crystalline alloy. However, the material of the sheet body 110 is not limited thereto, and all known materials used for a magnetic shielding sheet such as a ferrite, a polymer, a permalloy, and the like may be used.

Figure 3:
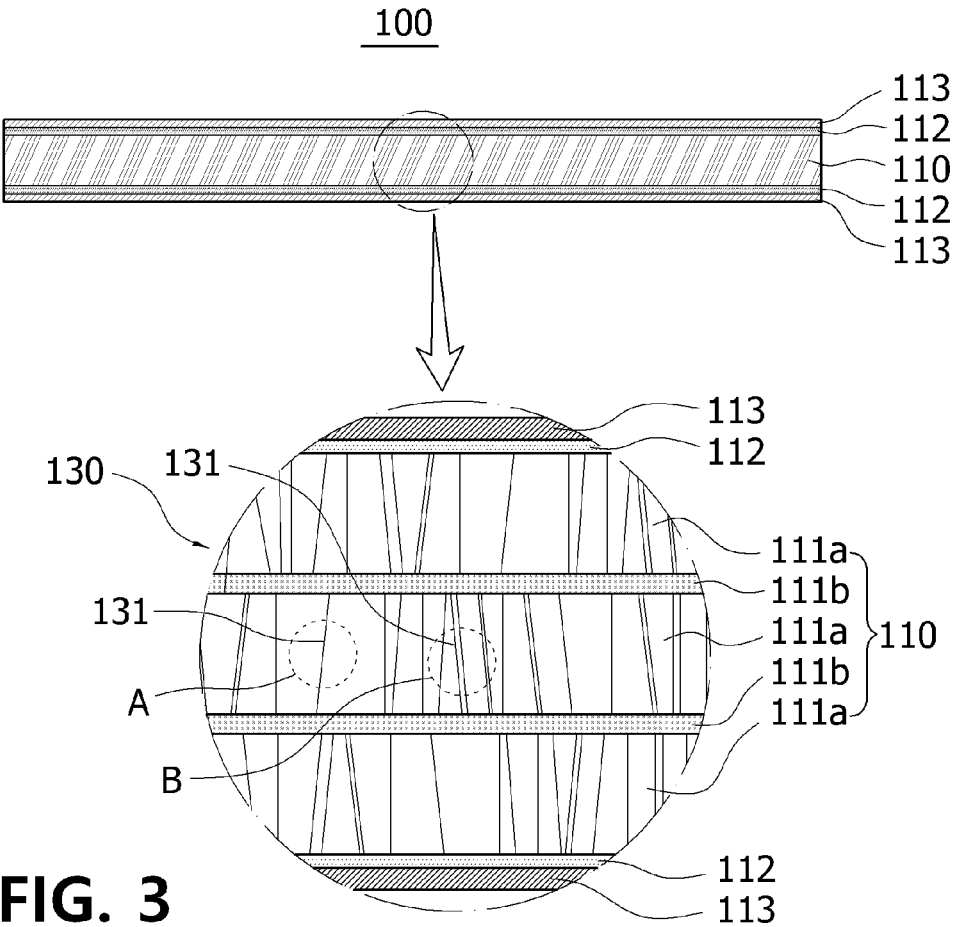
FIG. 3 is a schematic view illustrating a case in which the magnetic shielding sheet applied to the present invention is made of a multi-layer amorphous alloy or nano-crystalline alloy
Figure 4:
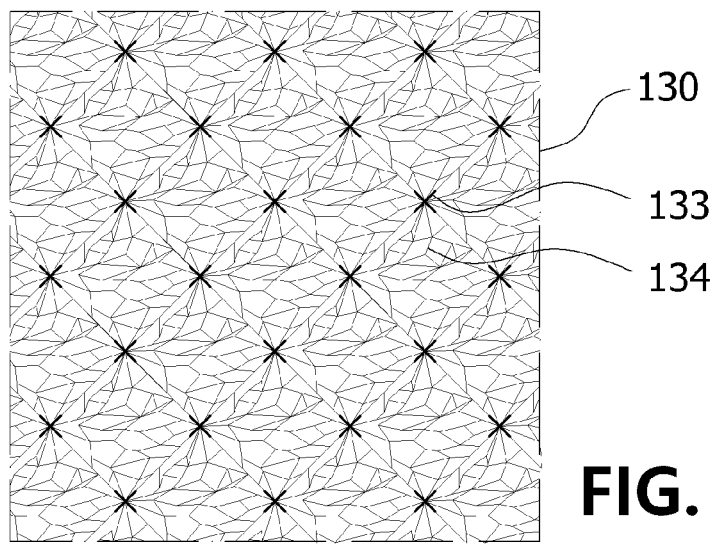
FIG. 4 is an enlarged view illustrating regular cracks and irregular cracks included in the crack part.

In one embodiment of the present invention, the sheet body 110 may be formed of a single layer ribbon sheet 111*a*, but as shown in FIG. 3, the sheet body 110 may be a multilayer sheet in which a plurality of ribbon sheets 111*a* are stacked in multiple layers through first adhesive layers 111*b*, and may also be a hybrid sheet in which a ribbon sheet of an amorphous alloy and a ribbon sheet of the nano-crystalline alloy are combined.

In this case, each of the ribbon sheets 111*a* constituting the sheet body 110 may be a heat-treated ribbon sheet, and a protective film 113 may be attached to at least one surface of an upper surface and a lower surface of the sheet body 110 through a second adhesive layer 112.

Preferably, the protective film 113 may be attached to each of the upper surface and the lower surface of the sheet body 110. In this case, the protective film 113 attached to the sheet body 110 may be a removable release film.

The magnetic shielding sheet 100 according to one embodiment of the present invention may include the eddy current-reducing pattern parts 120 formed inside the sheet body 110.

The eddy current-reducing pattern parts 120 may reduce the occurrence of an eddy current by increasing the overall resistance of the sheet body 110. Accordingly, in the antenna unit 200, since the influence of the eddy current may be reduced through the eddy current-reducing pattern parts 120, influence of the eddy current on the at least one antenna 220 or 230 may be reduced.

As an example, the eddy current-reducing pattern part 120 may be a physically deformed part by forming a crack part 130 or a through part 140 with respect to a partial area of the sheet body 110 to reduce the occurrence of the eddy current, and may be implemented in various forms according to the type, arrangement, and the like of the crack part 130 or the through part 140.

First, in one embodiment of the present invention, among the various forms of the eddy current-reducing pattern parts 120, a case in which the eddy current-reducing pattern part 120 is formed by the crack part 130 will be described.

Figure 2:
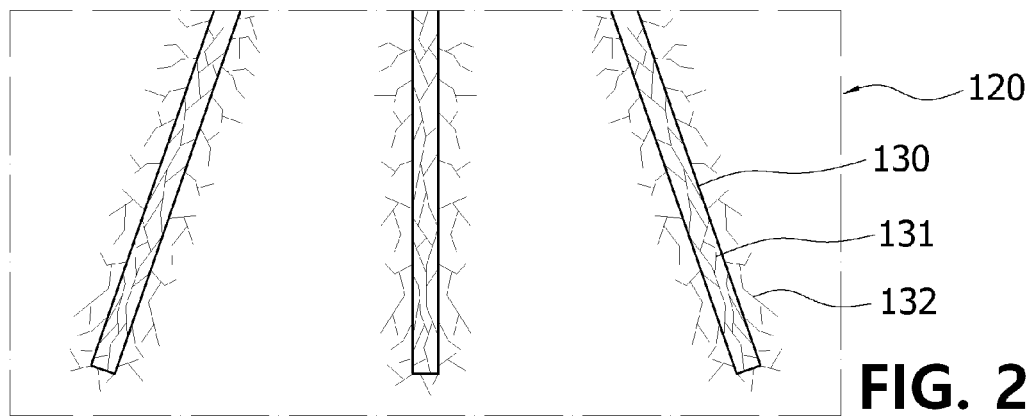
FIG. 2 is an enlarged view of portions of eddy current-reducing pattern parts in FIG. 1, and is a view conceptually illustrating detailed configurations of a crack part.

As shown in FIG. 2, the eddy current-reducing pattern parts 120 may be the crack parts 130 which are parts separated into a plurality of pieces by a plurality of cracks 131 for an area having a predetermined width and length among the sheet body 110. In this case, in the sheet body 110, a part other than the part formed to be separated into the plurality of pieces among the total area may be formed not to be separated into the plurality of pieces.

Figure 14:
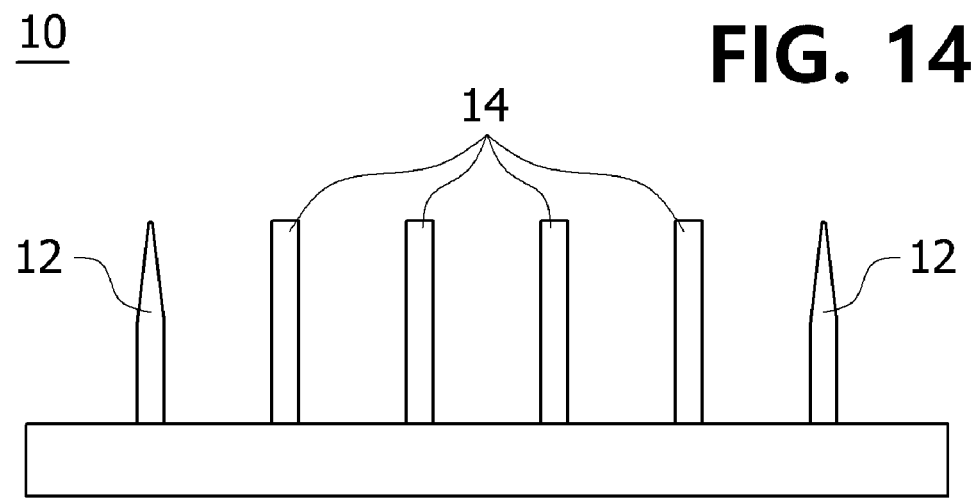
FIG. 14 is a view schematically illustrating a mold usable to manufacture the magnetic shielding sheet according to one embodiment of the present invention.

Here, the cracks 131 included in the crack parts 130 may each have a single layer structure which physically cuts the sheet body 110 so that the sheet body 110 is partitioned into a plurality of pieces, and the sheet body 110 may be formed by receiving pressure through a pressurizing member 14 or the like shown in FIG. 14 and cracking.

In this case, the plurality of pieces separated by the cracks 131 may maintain a state of being disconnected from each other and coming into contact with each other (see portion A in FIG. 3), and a fine space may be formed between the plurality of pieces. (see portion B in FIG. 3). The fine space formed like the above is similar in that a space is formed between the sheet body 110 compared to the following through part 140, but may be distinguished from the through part 140 in that a width is very fine.

As a non-limiting example of the crack part 130 including the crack 131, the area where the crack part 130 is formed may be formed in a linear shape having a predetermined width and length as shown in FIG. 2.

In this case, the linear crack part 130 may be formed by applying pressure on one surface of the sheet body 110 through the pressurizing member 14 or the like formed so that an end portion which comes into contact with the sheet body 110 corresponds to the linear area. Accordingly, the plurality of cracks 131 may be formed in the sheet body 110 for the linear area having a predetermined width and length, and the sheet body 110 may be formed to be separated into the plurality of pieces.

Further, in the sheet body 110, not only the cracks 131 are formed for the linear area but also a plurality of cracks 132 may be additionally formed to extend from edges which define the crack parts 130.

That is, in order to form the cracks 131 in the sheet body 110 for the linear area, the cracks 132 extending outward from the edges which define the crack parts 130 may also be formed in a process of pressurizing the sheet body 110 through the pressurizing member 14.

Meanwhile, as another example of the crack part 130 including the crack 131, the crack part 130 may include a plurality of regular cracks 133 each formed in a predetermined shape and a plurality of irregular cracks 134 derived from the plurality of regular cracks 133.

Figure 16:
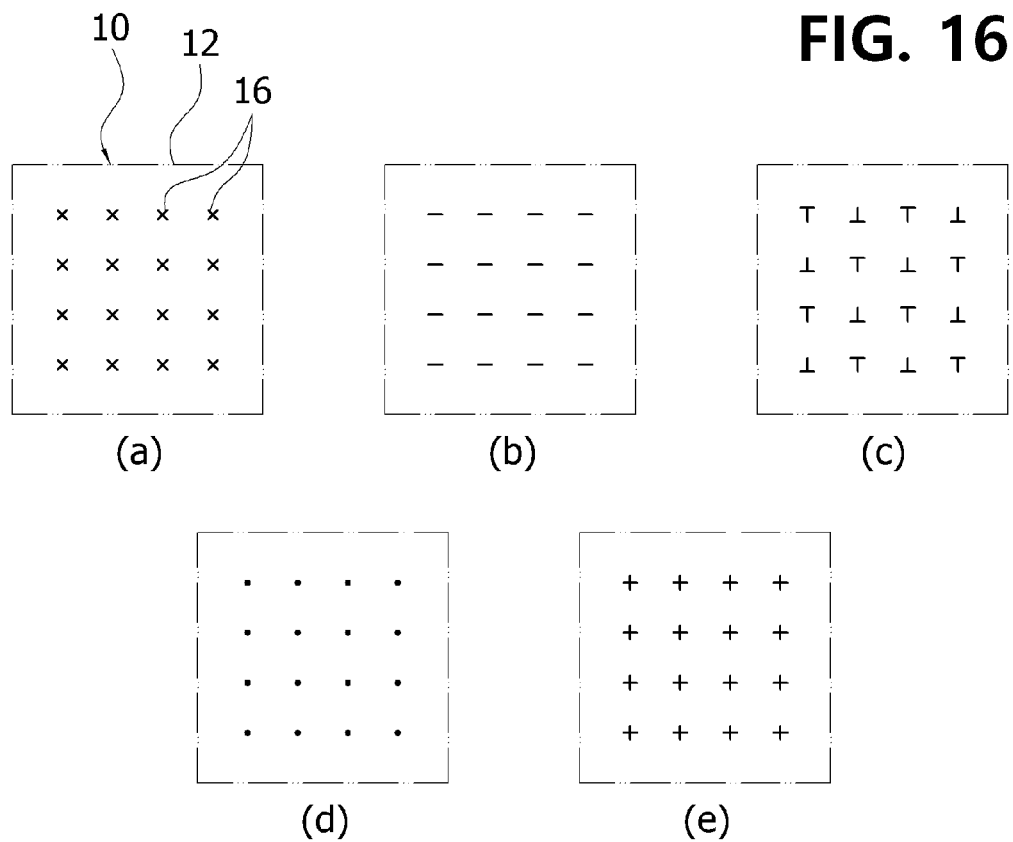
FIG. 16 is a view illustrating various shapes of the crack blade applied to the present invention.

More specifically, as shown in FIG. 16, when the sheet body 110 is pressurized by crack blades 16 each formed in a predetermined shape, the regular cracks 133 each having a shape corresponding to the crack blade 16 may be formed in the sheet body 110. In this case, since not only the regular cracks 133 but also the irregular cracks 134 are induced together, the plurality of cracks 133 and 134 may be entirely formed in a predetermined area adjacent to the crack blades 16.

The crack part 130 in which a predetermined area included in the sheet body 110 is separated into the plurality of pieces may be formed by the regular cracks 133 and the irregular cracks 134.

In this case, as an example, the regular crack 133 may have a cross-sectional shape such as '−', '+', '*', '⊥', and '·' (see FIG. 16) and descriptions related thereto will be described in more detail through descriptions related to a method of manufacturing the magnetic shielding sheet according to one embodiment of the present invention.

Like the above, the magnetic shielding sheet 100 according to according to one embodiment of the present invention may reduce the influence of the eddy current by forming various types of cracks 131 to 134 for a local region of the sheet body 110 and increasing the overall resistance of the sheet body 110 to reduce the occurrence of the eddy current.

Next, a case in which the eddy current-reducing pattern parts 120 are formed by the through parts 140 in addition to the above-described crack parts 130 among the various forms of eddy current-reducing pattern parts 120 will be described.

Figure 5:
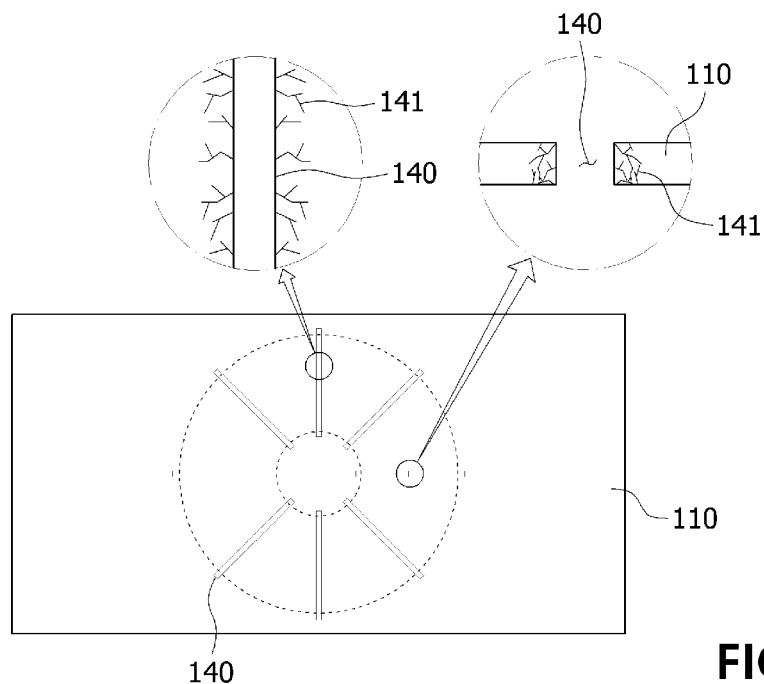
FIG. 5 is a view conceptually illustrating detailed configurations of through parts among the eddy current-reducing pattern part in FIG. 1.

The magnetic shielding sheet 100 according to one embodiment of the present invention may include the through part 140 formed in an inner region of the sheet body 110, and a plurality of cracks 141 formed to extend from the through part 140 as the eddy current-reducing pattern part 120 as shown in FIG. 5.

As an example, the through part 140 may be formed to pass through the sheet body 110, and the plurality of cracks 141 may be formed to extend from the through part 140 to the inner side of the sheet body 110. In this case, the plurality of cracks 141 may be formed by be inducing from the through part 140 through an external force applied to the sheet body 110 while the through part 140 is formed in the sheet body 110.

Here, the plurality of cracks 141 are different from the above-described cracks 131 to 134 only in that a cause of their generation is induced during the process of forming the through parts 140, and a structure may be similar in that the sheet body 110 is physically cut.

In this case, the plurality of cracks 141 formed from the through part 140 may be connected to each other or may not be connected to each other. Further, only some cracks of the plurality of cracks 141 may be connected to each other.

Accordingly, in the magnetic shielding sheet 100 according to one embodiment of the present invention, since the overall resistance may be increased through the through part 140 and the plurality of cracks 141 formed in the sheet body 110, the influence of the eddy current may be reduced. That is, the through part 140 and the plurality of cracks 141 formed in the sheet body 110 may function as an eddy current-reducing means capable of reducing the eddy current.

In this case, the through part 140 may be formed to have a predetermined width and length, and may be formed in an appropriate number of one or more. Further, the through part 140 may be formed to have a length greater than a width thereof. In addition, the total number of the plurality of cracks 141 may be relatively greater than the total number of the through parts 140.

As a non-limiting example of the through part 140, the through part 140 may be formed in a linear shape whose length is greater than its width as shown in FIG. 5.

Figure 6:
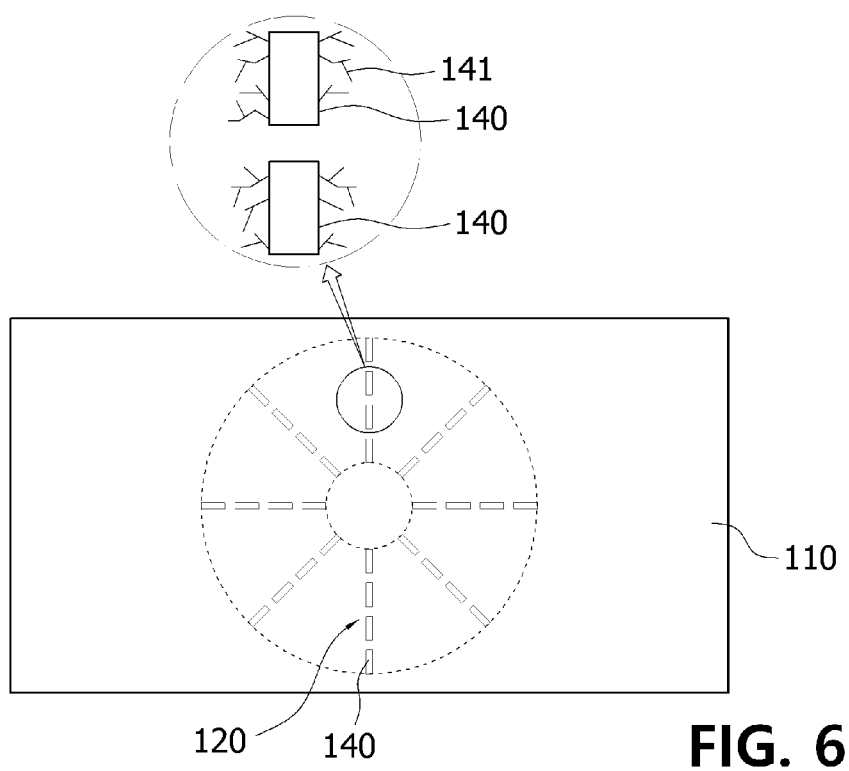
FIG. 6 is a view conceptually illustrating the through parts in a dotted line shape.

As another example, as shown in FIG. 6, the plurality of through parts 140 may be linearly disposed along one direction to form a dotted line shape as a whole, and may be spaced apart from each other by a predetermined distance. Forming the plurality of through parts 140 to form the dotted line shape is to minimize a length in a longitudinal direction of a protrusion 18 passing through the sheet body 110.

Figure 7:
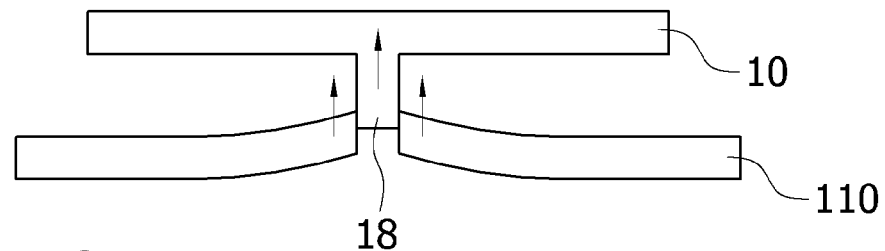
FIG. 7 is a view conceptually illustrating the behavior of a portion of a sheet body which comes into contact with a protrusion when the through parts are formed.
Figure 19:
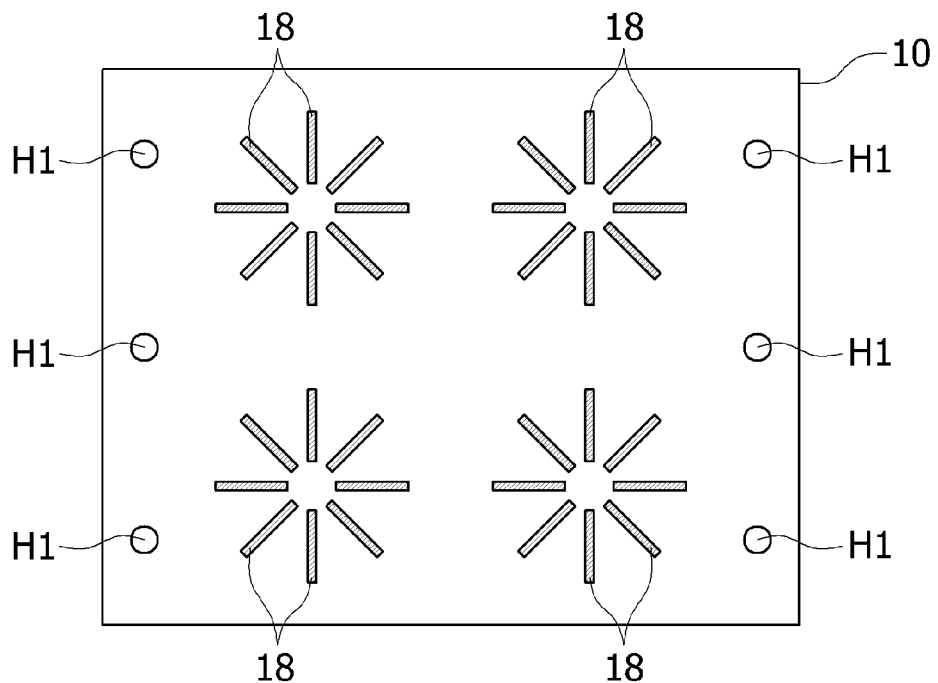
FIGS. 19 and 20 are plan views illustrating a mold applicable to FIG. 18.

More specifically, when the through parts 140 are formed through the linear protrusion 18 extending in the longitudinal direction as shown in FIG. 19, as shown in FIG. 7, portions of the sheet body disposed at both sides of the protrusion 18 may also behave in the same direction as the protrusion 18 by an adhesive force between the protrusion 18 and the sheet body 110 during a process in which the protrusion 18 passes through the sheet body 110 and returns to an original position thereof.

In this case, the behavior between the portions of the sheet body disposed at both sides of the protrusion 18 may be formed to be asymmetrical to each other, and since a behavior range of the portions of the sheet body disposed at both sides of the protrusion 18 increases as the length of the protrusion 18 in the longitudinal direction increases, a degree of asymmetry of the portions of the sheet body disposed at both sides of the protrusion 18 may also increase.

Since there is a problem in that the asymmetry not only degrades the function of the eddy current-reducing pattern part 120 itself, but also causes an electrical short circuit, and thus a separate planarization process may be required, functionally, the asymmetry may act as a disadvantage in a process.

As described above, the magnetic shielding sheet 100 according to one embodiment of the present invention may effectively solve the above-described problem caused by the asymmetry of the sheet body 110 by minimizing the length of the protrusion 18 in the longitudinal direction to form the through part 140 in the dotted line shape.

In one embodiment of the present invention, as described above, the sheet body 110 may include the protective film 113 attached to at least one surface through the adhesive layers 112.

In this case, the protective film 113 may be attached to the sheet body 110 to cover the part 120 formed to be separated into the plurality of pieces. Accordingly, even when the sheet body 110 includes the eddy current-reducing pattern part 120, which is the part formed to be separated into the plurality of pieces, separation of the pieces constituting the eddy current-reducing pattern part 120 may be prevented, and the sheet body 110 may maintain a plate shape through the protective film 113.

Further, when the eddy current-reducing pattern part 120 is formed including the through part 140, the eddy current-reducing pattern part 120 may be formed to pass through the protective film 113 in addition to the sheet body 110. This will be described in more detail through the description of the following method of manufacturing the magnetic shielding according to one embodiment of the present invention.

In the magnetic shielding sheet 100 according to one embodiment of the present invention, the eddy current-reducing pattern part 120 may be formed in an appropriate number of one or more for a partial area among the total area of the sheet body 110, and may be partially formed for the partial area among the total area of the sheet body 110.

Accordingly, the magnetic shielding sheet 100 according to one embodiment of the present invention may minimize the influence of the eddy current and have a high permeability of 2000 or more at a very thin thickness by partially forming the eddy current-reducing pattern part 120 in a partial region corresponding to the region where the antenna 220 or 230 is disposed to increase the overall resistance of the sheet itself.

As an example, the magnetic shielding sheet 100 according to one embodiment of the present invention may have a high permeability of 2000 or more even at a very thin thickness in which a total thickness is 55 μm to 85 μm.

Accordingly, the magnetic shielding sheet 100 according to one embodiment of the present invention may increase the inductance of the at least one antenna 220 or 230 while realizing thinning through a very thin thickness.

Figure 9:
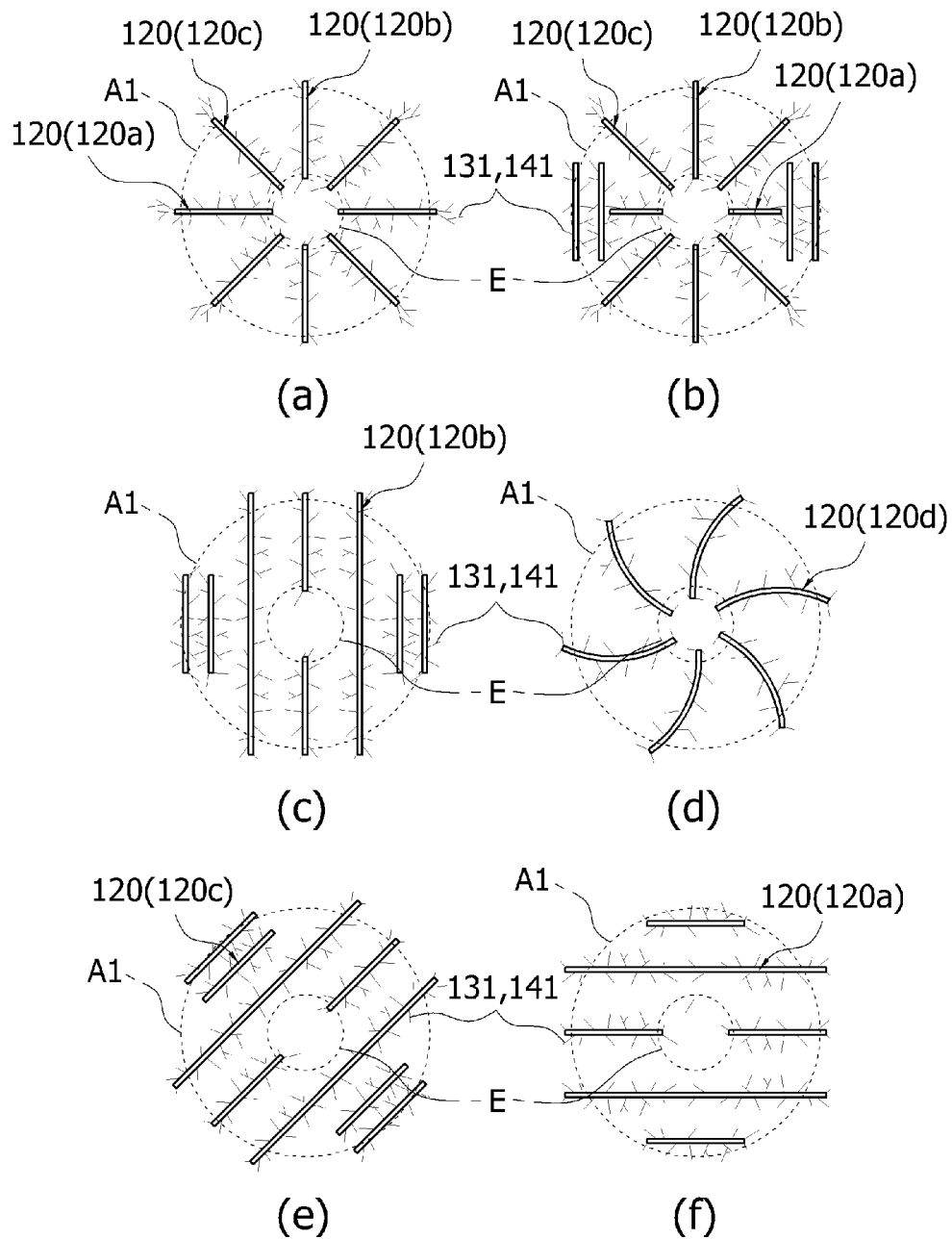
FIG. 9 is a view conceptually illustrating various types of eddy current-reducing pattern parts which may be formed in the regions corresponding to the pattern parts of the antenna in FIG. 8 and cracks induced therefrom.
Figure 11:
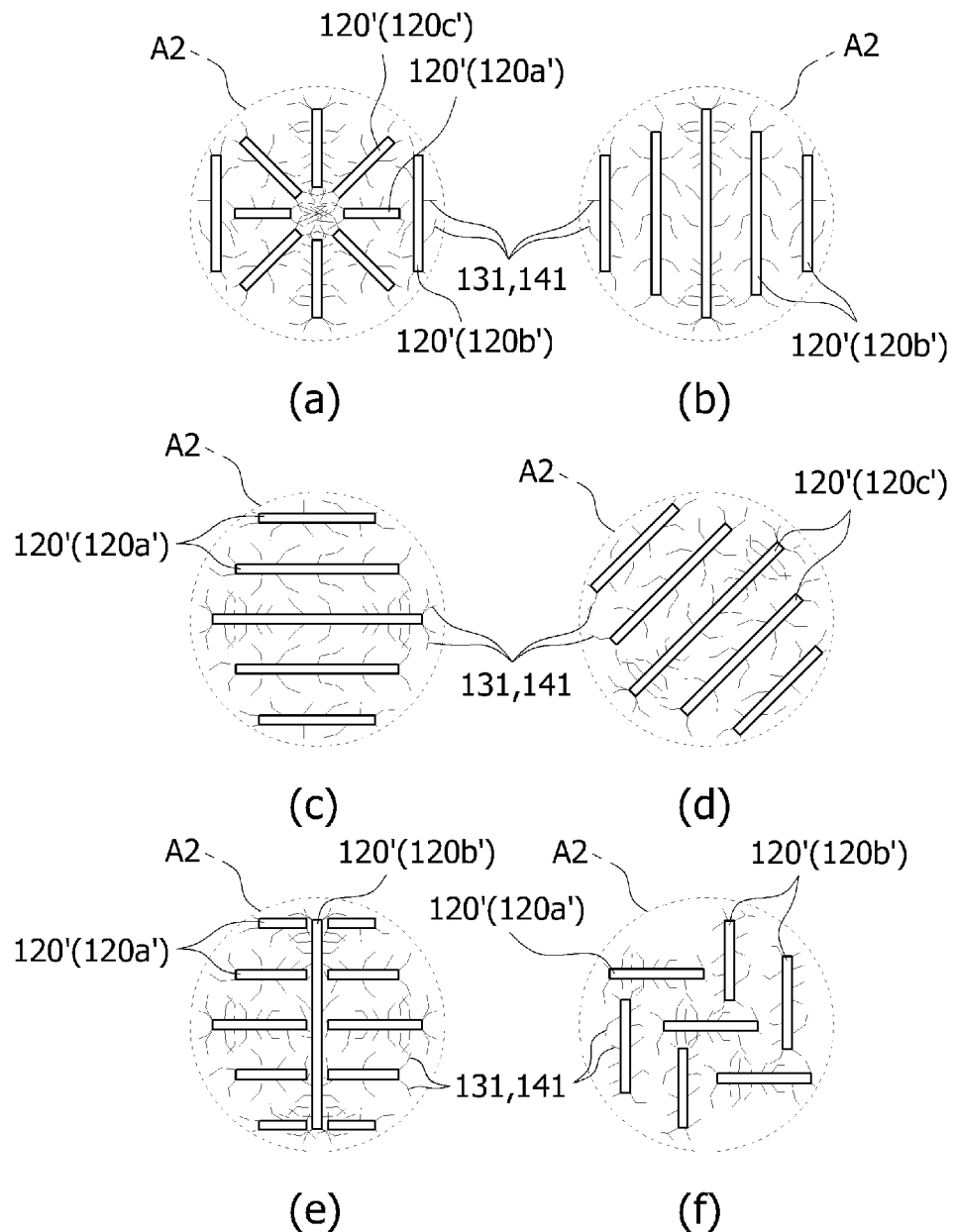
FIG. 11 is a view conceptually illustrating various types of eddy current-reducing pattern parts which may be formed in the regions corresponding to the hollow parts of the antenna in FIG. 10 and cracks induced therefrom.

As shown in FIG. 1, the eddy current-reducing pattern part 120 may be radially formed with respect to a center point of an inner hollow part of the antenna 220 or 230. However, the arrangement form of the eddy current-reducing pattern part 120 in the magnetic shielding sheet 100 according to one embodiment of the present invention is not limited thereto, and when the eddy current-reducing pattern part 120 is formed at a position corresponding to the antenna 220 or 230, the eddy current-reducing pattern part 120 may be formed in various ways as shown in FIGS. 9 and 11.

Further, when the antenna unit 200 includes a plurality of antennas, the eddy current-reducing pattern parts 120 may be formed in regions respectively corresponding to the plurality of antennas, or may be formed only in regions corresponding to some antennas among the plurality of antennas.

As a specific example, the eddy current-reducing pattern parts 120 may be partially formed only in a partial area of a total area of a shielding sheet 300 which is a final product.

Figure 8:
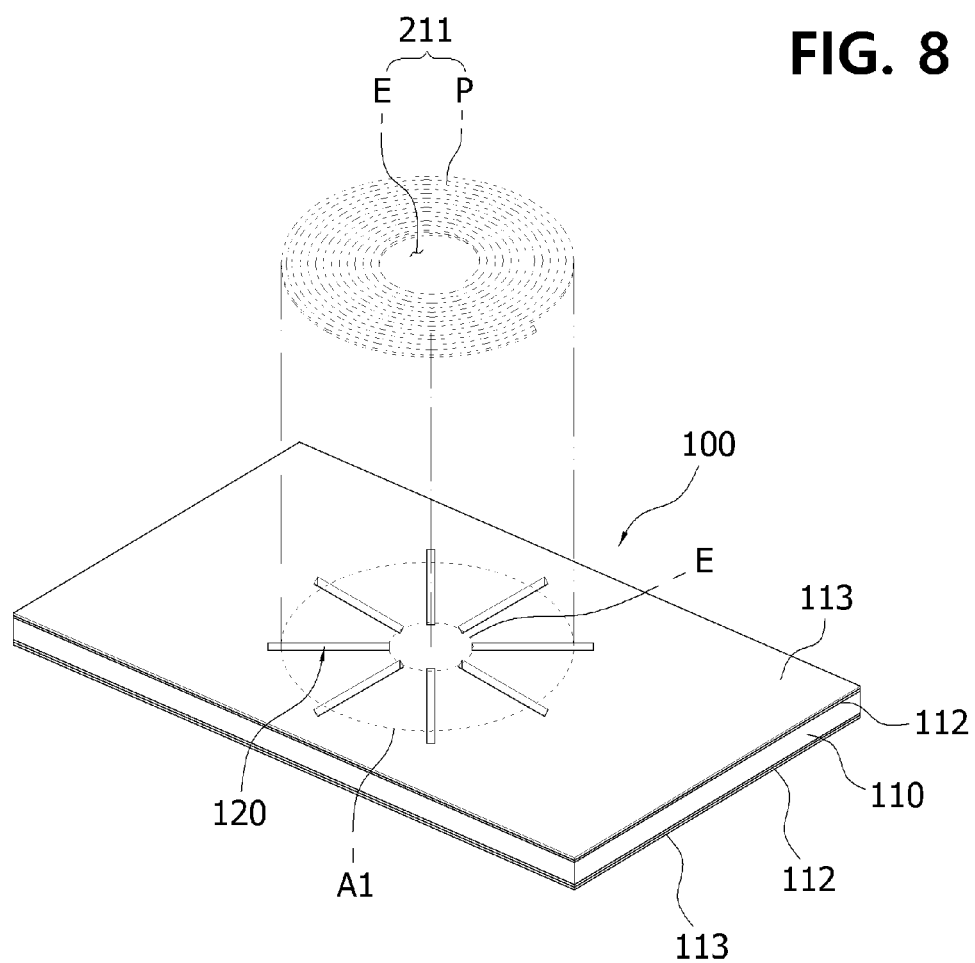
FIG. 8 is a view illustrating a case in which the eddy current-reducing pattern parts are formed in regions corresponding to pattern parts of an antenna.

That is, as shown in FIG. 8, the eddy current-reducing pattern parts 120 may be formed in a partial area where a pattern part P of an antenna 211 is disposed among the total area of the shielding sheet 300 which is a final product, and the partial area where the pattern part P of the antenna 211 is disposed may be the above-described disposition region A1.

Accordingly, in the shielding sheet 300, the eddy current-reducing pattern parts 120 may be formed only in the partial area corresponding to the pattern part P of the antenna 211 among the total area of the shielding sheet 300.

In this case, the eddy current-reducing pattern parts 120 formed in the partial area corresponding to the pattern part P of the antenna 211 may be formed in various ways as shown in FIG. 9.

Figure 10:
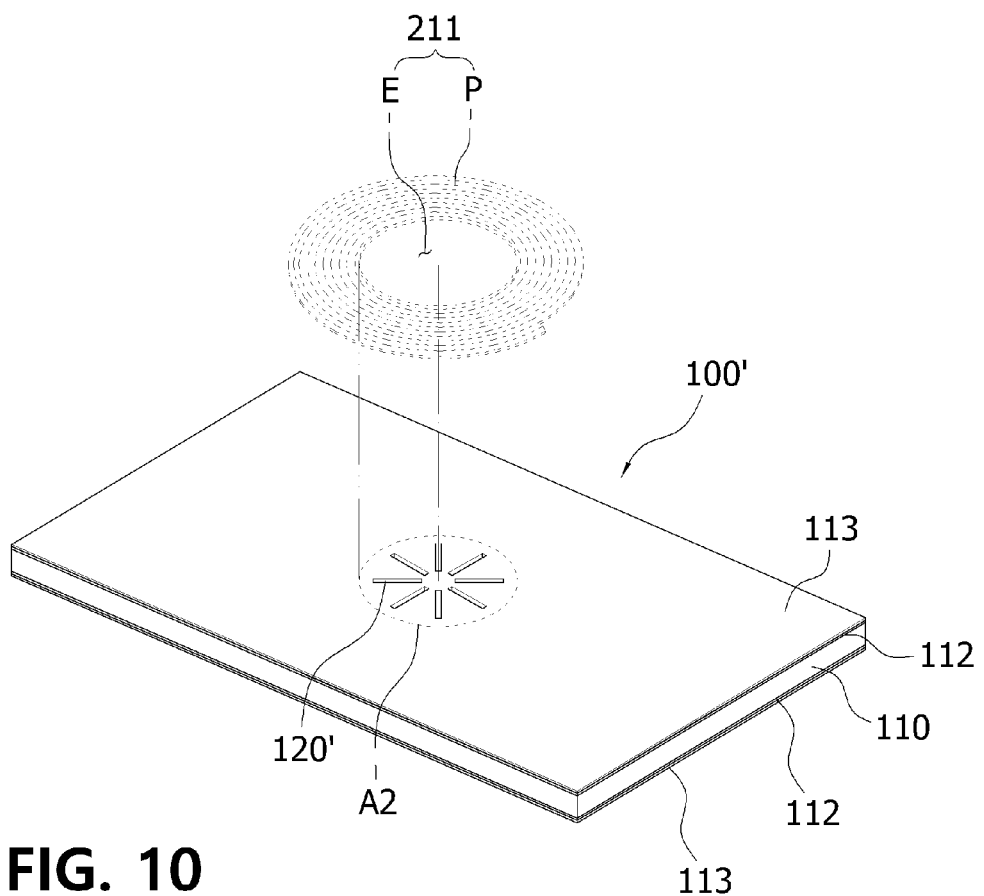
FIG. 10 is a view illustrating a case in which the eddy current-reducing pattern parts are formed in regions corresponding to hollow parts of the antenna.

As another example, as shown in FIG. 10, the eddy current-reducing pattern parts 120 may be formed only in a partial area where magnetic flux is concentrated among the total area of the shielding sheet 300 which is a final product, and as described above, the partial area where the magnetic flux is concentrated may be a corresponding region A2 corresponding to a hollow part E of the antenna 211.

Accordingly, in the shielding sheet 300 which is a final product, the eddy current-reducing pattern parts 120 may be formed only in the partial area corresponding to the hollow part E of the antenna 211 among the total area of the shielding sheet 300. In this case, the eddy current-reducing pattern parts 120 formed in the partial area corresponding to the hollow part E of the antenna 211 may be formed in various ways as shown in FIG. 11.

The above-described magnetic shielding sheet 100 according to one embodiment of the present invention may be implemented as a wireless power transmission module 400 for wireless power transmission.

As an example, as shown in FIG. 12, the wireless power transmission module 400 may include the antenna unit 200 including a wireless power transmission antenna 220 for wireless power transmission and the magnetic shielding sheet 100 disposed on one surface of the antenna unit 200 to shield a magnetic field and concentrate the magnetic field in a desired direction.

Here, the antenna unit 200 may be a combo antenna unit including a wireless communication antenna 230 disposed to surround the periphery of the wireless power transmission antenna 220 in addition to the wireless power transmission antenna 220, and the wireless power transmission antenna 220 and the wireless communication antenna 230 may be antenna patterns patterned on one surface of a circuit board 210.

Like the above, when the antenna unit 200 is formed as the combo antenna unit, the eddy current-reducing pattern parts 120 may be formed only in a region corresponding to the region where the wireless power transmission antenna 220 is disposed among the total area of the sheet body 110. That is, the eddy current-reducing pattern parts 120 may not be formed in the remaining region of the combo antenna unit 200 excluding the region corresponding to the region where the wireless power transmission antenna 220 is disposed.

Specifically, the eddy current-reducing pattern parts 120 may not be formed in a region corresponding to a region where the wireless communication antenna 230 is disposed.

Accordingly, the magnetic shielding sheet 100 according to one embodiment of the present invention may minimize the influence of the eddy current and have a high permeability of 2000 or more at a very thin thickness by partially forming the eddy current-reducing pattern part 120 in a partial region corresponding to the region where the wireless power transmission antenna 220 is disposed to increase the overall resistance of the sheet itself.

Meanwhile, the antenna unit 200 may further include an antenna for MST.

Here, the magnetic shielding sheet 100 constituting the wireless power transmission module 400 may be the above-described magnetic shielding sheet 100, and since the magnetic shielding sheet 100 is the same as the above-described content, detailed descriptions will be omitted.

The wireless power transmission module 400 may be implemented as a wireless power reception module in which the wireless power transmission antenna 220 serves as a antenna for wireless power reception which receives wireless power, and the wireless power transmission antenna 220 may be implemented as a wireless power transmission module in which the wireless power transmission antenna 220 serves as a wireless power transmission antenna which transmits wireless power to the outside.

Further, when the wireless power transmission module 400 is implemented as the wireless power reception module, the wireless power transmission module 400 may be applied to a mobile terminal device such as a mobile phone, a tablet PC, or the like.

Meanwhile, the above-described magnetic shielding sheet 100 may be manufactured through the following method.

Figure 13:
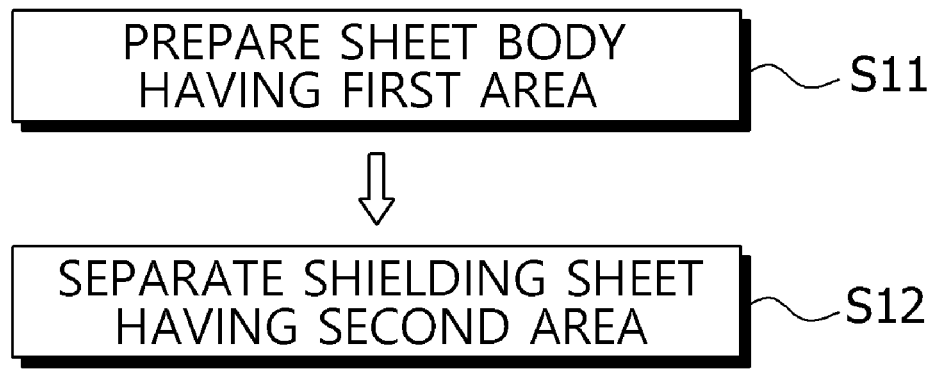
FIG. 13 is a flow chart illustrating a method of manufacturing the magnetic shielding sheet according to one embodiment of the present invention.

Referring to FIG. 13, first, when forming the eddy current-reducing pattern parts 120 by forming the crack parts 130, the method of manufacturing the magnetic shielding sheet according to one embodiment of the present invention may include a first operation S11 and a second operation S12.

As an example, the first operation S11 may be an operation of preparing a plate-shaped sheet body made of a magnetic material and having a first area, and the second operation S12 may be an operation of applying pressure to a local area of a shielding sheet so that the sheet body is separated into the shielding sheet having a second area which is relatively smaller than the first area, and the local area among an inner region of the shielding sheet may be separated into a plurality of pieces.

In this case, in the magnetic shielding sheet manufactured through the manufacturing method according to one embodiment of the present invention, the above-described crack parts 130 may be formed through the second operation S12.

Specifically, the first operation S11 may be a pre-operation for producing the magnetic shielding sheet 100 cut to a predetermined size from the sheet body having the first area according to a place of use and a usage to become a final product. The sheet body may be made of the same material as the above-described sheet body 110.

That is, the sheet body may be a plate-shaped sheet having the first area, and may be made of a magnetic material. Further, all of the materials mentioned as the above-described material of the sheet body 110 may be used for the sheet body having the first area. In addition, the sheet body may be formed of a material including a metal component and may be a sheet subjected to heat treatment.

Meanwhile, in the second operation S12, the shielding sheet 100 having the second area which is relatively smaller than the first area may be separated from the sheet body having the first area through the mold 10.

Accordingly, in the method of manufacturing the magnetic shielding sheet according to one embodiment of the present invention, a plurality of shielding sheets 100 may be produced from one magnetic sheet through the second operation S12.

In this case, in the method of manufacturing the magnetic shielding sheet according to one embodiment of the present invention, as described above, the crack parts 130 may be formed in the shielding sheet 100 while separating the sheet body having the first area into the shielding sheets 100 having the second area through the second operation.

That is, in the second operation S12, the crack parts 130 may also be formed in the shielding sheet 100 separated with the second area while separating the sheet body having the first area into the shielding sheets 100 having the second area through one process using one mold 10.

The second operation S12 may be performed using the mold 10 shown in FIG. 14.

That is, the mold 10 may include cutting blades 12 for processing an edge of the shielding sheet, and at least one pressurizing member 14 disposed inside the cutting blades 12 and provided for pressurizing the local area without passing through the sheet body.

As an example, as shown in FIG. 14, the pressurizing members 14 may each have a bar shape having a predetermined length, and may be formed in an appropriate number of one or more.

Figure 15:
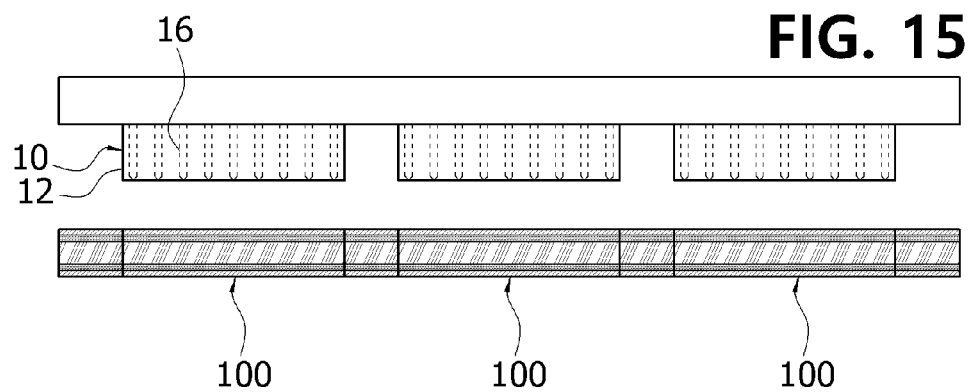
FIG. 15 is a view schematically illustrating a process by a crack blade in the method of manufacturing the magnetic shielding sheet according to one embodiment of the present invention.

As another example, as shown in FIG. 15, the pressurizing members 14 may be crack blades 16 each having a shape corresponding to the shape of the above-described regular crack 133, and like the above, may be formed in an appropriate number of one or more.

In this case, a plurality of pressurizing members 14 may be provided inside the cutting blades 12, and the plurality of pressurizing members 14 may be disposed to be spaced apart from each other at intervals.

Further, an end portion of each of the pressurizing members 14 may form a horizontal surface with an end portion of each of the cutting blades 12, but may have a length not protruding from the end portion of the cutting blade 12.

In this case, the pressurizing member 14 may be formed so that the end portion which comes into contact with the sheet body may have a predetermined width and length or a cross-sectional area having the shape corresponding to the above-described regular crack 133, and the cutting blade 12 may be formed to have substantially the same shape as the entire edge of the shielding sheet 100 which is a final product.

Accordingly, when the sheet body having the first area is pressurized by the mold 10 during the second operation, while the sheet body having the first area is separated into the shielding sheets 100 having the second area through the cutting blades 12, in the shielding sheet 100 separated from the sheet body, the crack parts 130 may be formed at positions corresponding to the pressurizing members 14 among the inner region.

Here, the cutting blades 12 may pressurize the sheet body to pass through the sheet body having the first area.

Further, the pressurizing member 14 may pressurize the sheet body to pass through or not pass through the sheet body in some cases.

Specifically, when the end portion of the pressurizing member 14 is formed to have the cross-sectional area having the predetermined width and length (see FIG. 14), the pressurizing member 14 may pressurize the sheet body not to pass through the sheet body, and the pressurizing member 14 may pressurize the sheet body to pass through the sheet body when formed as the above-described crack blade 16.

Further, during the second operation, in the process of forming the crack parts 130 through the pressurizing members 14, the cracks 132 may be caused by the edges which define the crack parts 130 or the irregular cracks 134 derived from the plurality of regular cracks 133 may be caused.

Accordingly, in the manufacturing method according to one embodiment of the present invention, an area corresponding to a position of the pressurizing member 14 may be formed to be separated into a plurality of pieces by providing a pressurizing force to the sheet body side through the pressurizing member 14. Accordingly, the crack parts 130 may be formed in the area corresponding to the position of the pressurizing member 14.

That is, in the method of manufacturing the magnetic shielding sheet according to one embodiment of the present invention, a production process may be simplified by forming the crack parts 130 together through one process of separating the shielding sheet 100 having a predetermined size from the sheet body without performing an additional process.

Accordingly, in the shielding sheet 100 manufactured through the method of manufacturing the magnetic shielding sheet according to one embodiment of the present invention, overall resistance may be increased through the crack parts 130, and transmission efficiency of an antenna may be increased by reducing the loss by the eddy current and increasing a Q value.

Further, in the manufacturing method according to one embodiment of the present invention, since a part to which the pressurizing force is provided by the pressurizing member 14 is only formed to be separated into a plurality of pieces, the generation of burrs in the part where the crack parts 130 are formed or generation of particles separated from the crack parts 130 may be prevented.

Accordingly, in the manufacturing method of the present invention, since short circuit defects of the antenna 220 or 230 due to the burrs or particles may be improved, a production yield may be increased. Further, when the antenna 220 or 230 is provided with an antenna pattern formed on the circuit board 210, since the short circuit of the antenna due to the burrs or particles is fundamentally prevented, short circuit defects of the antenna due to the burrs or pieces may be improved even when a thickness of a coverlay included in the circuit board 210 is not increased.

Accordingly, the circuit board 210 may use the same thin thickness of the coverlay as in the related art. Accordingly, the magnetic shielding sheet 100 manufactured by the manufacturing method according to one embodiment of the present invention has an advantage in that generation of a short circuit due to the burrs or particles may be fundamentally prevented and thus an overall thickness may be reduced while reducing production costs even when the antenna unit 200 to which the circuit board 210 including a conventional coverlay having a thin thickness is applied is used.

Figure 17:
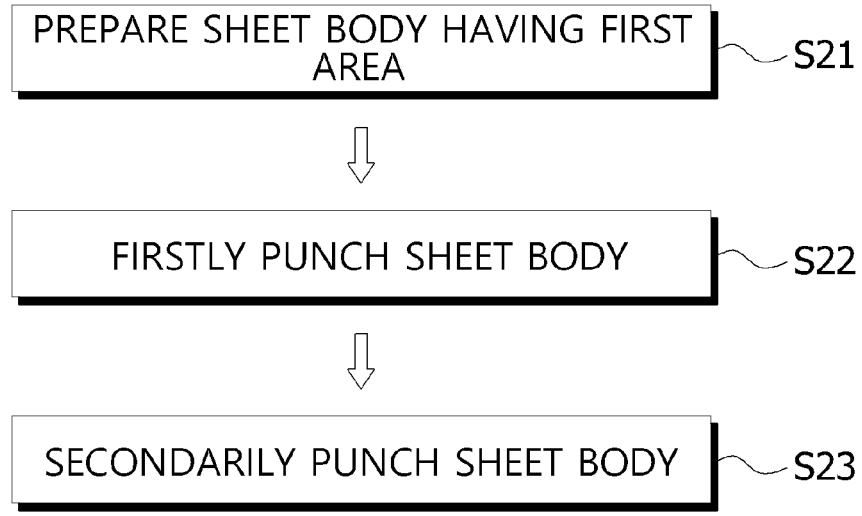
FIG. 17 is a flow chart illustrating a method of manufacturing a magnetic shielding sheet according to another embodiment of the present invention.

Next, referring to FIG. 17, when the eddy current-reducing pattern parts 120 are formed by forming the through parts 140, the method of manufacturing the magnetic shielding sheet according to one embodiment of the present invention may include an operation of preparing a sheet body M having a first area (S1), an operation (S2) of firstly punching the sheet body M, and an operation (S3) of secondarily punching the sheet body M.

The operation of preparing the sheet body M having the first area (S1) may be a preparing operation for manufacturing the shielding sheet 300 which is a final product cut to a predetermined size according to a place of use and a usage.

Figure 25:
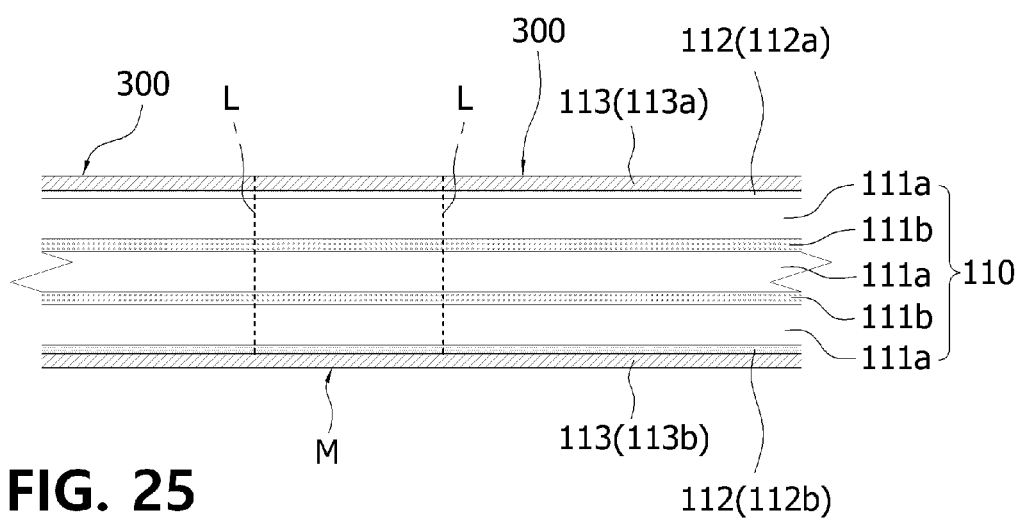
FIG. 25 is a cross-sectional view taken along line A-A in FIG. 24.

That is, as shown in FIG. 25, the shielding sheet 300 may include a sheet body 110 having a second area, the above-described through parts 140 and cracks 141 may be formed in the sheet body 110 having the second area through the operation (S2) of firstly punching the sheet body M having the first area and the operation (S3) of secondarily punching the sheet body M having the first area.

As described above, the sheet body M having the first area may be a plate-shaped sheet having the first area, and may be formed of a magnetic material.

In this case, the sheet body M having the first area may be formed of a material including a metal component and may be a sheet subjected to heat treatment so that a plurality of cracks 141 may be caused by the through parts 140 by an external force in a process of forming the through parts 140 in the sheet body M having the first area.

When the sheet body M is formed as a multilayer sheet, the operation of preparing the sheet body M having the first area (S1) may include an operation of forming a multilayer sheet having the first area formed as a multilayer by stacking a plurality of ribbon sheets 111a through first adhesive layers 111b, and an operation of attaching a protective film 113 to at least one of an upper surface and a lower surface of the multilayer sheet through second adhesive layers 112 coated with an adhesive on both surfaces of a base material.

In this case, as described above, the protective film 113 attached to the sheet body M having the first area may be a removable release film.

Accordingly, when an outer edge L which defines the second area is formed at the sheet body M having the first area through the operation (S3) of secondarily punching to be described later, the shielding sheet 300 having the second area may be separated from the sheet body M having the first area in a state in which the second adhesive layer 112 is exposed at one surface.

Accordingly, another component may be attached to the shielding sheet 300 separated from the sheet body M having the first area using the second adhesive layer 112 formed on one surface thereof.

Figure 18:
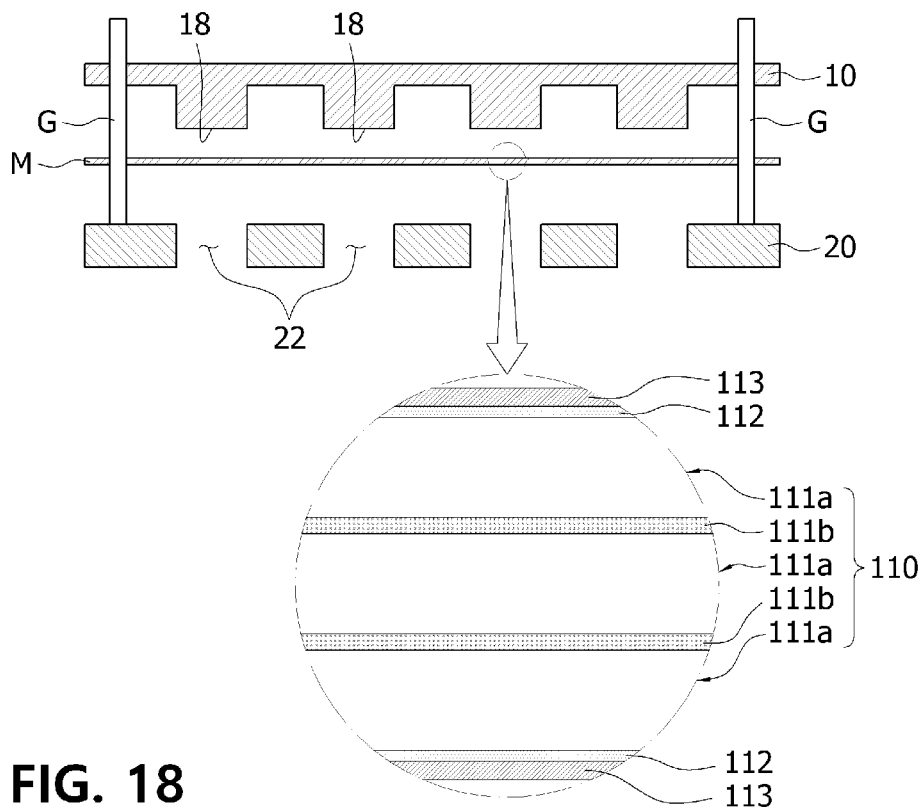
FIG. 18 is a view conceptually illustrating one form of a mold usable in an operation of firstly punching in the method of manufacturing the magnetic shielding sheet according to another embodiment of the present invention.

As a non-limiting example, as shown in an enlarged view in FIG. 18, the sheet body M having the first area may include a pair of protective films 113 attached to the upper surface and the lower surface thereof through the second adhesive layers 112. In this case, the second adhesive layer 112 may have an adhesive coated on both surfaces of the base material.

However, the present invention is not limited thereto, the protective film 113 may be attached to only one of the upper and lower surfaces of the sheet body 110 having the first area through the second adhesive layer 112, and the second adhesive layer 112 may be a liquid-type adhesive or a gel-type adhesive.

The operation (S2) of firstly punching the sheet body M having the first area may be an operation of forming a plurality of cracks 141 extending from through parts 140 while forming the through parts 140 each having a predetermined width and length in an inner region of the sheet body M having the first area. Here, the through part 140 may be a linear through part having a predetermined width and length or the above-described through part having a dotted line shape.

That is, the operation (S2) of firstly punching the sheet body M having the first area may be an operation of forming the through parts 140 in an inner region of the outer edge L defined through the operation (S3) of secondarily punching the sheet body M having the first area to be described later, and may be an operation of simultaneously forming the plurality of cracks 141 induced from the through parts 140 with the through parts 140.

The operation (S2) of firstly punching the sheet body having the first area may be performed using a punching device shown in FIG. 18.

As an example, the punching device may include an upper mold 10 for first punching provided with a plurality of protrusions 18 formed to protrude to a predetermined height on one surface thereof, a lower mold 20 for first punching disposed under the upper mold 10 for first punching and provided with a plurality of opening holes 22 formed to pass through positions corresponding to the plurality of protrusions 18, and a plurality of guide bars G which guide a movement direction of upper mold 10 for first punching.

In this case, the plurality of protrusions 18 and the plurality of opening holes 22 may have shapes corresponding to the above-described through parts 140.

As an example, the plurality of protrusions 18 and the plurality of opening holes 22 may each be formed in a linear shape having a predetermined width and length or the above-described dotted line shape, and may each be formed in an appropriate number of one or more. Further, the plurality of protrusions 18 and the plurality of opening holes 22 may each be formed to have a length greater than a width thereof.

Figure 20:
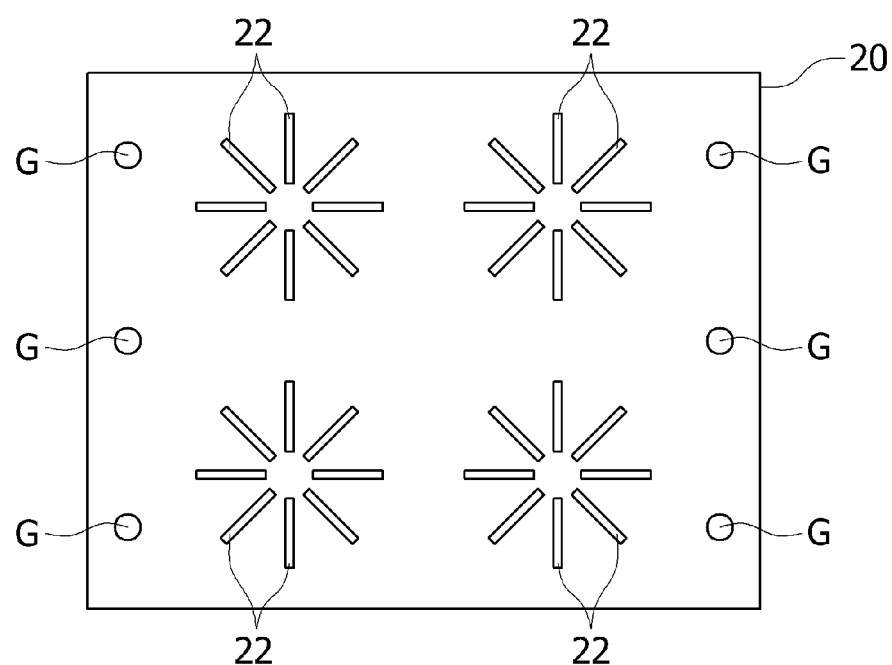

In addition, as shown in FIGS. 19 and 20, the plurality of protrusions 18 and the plurality of opening holes 22 may be disposed to be spaced apart from each other at intervals, and may be radially disposed with respect to a virtual center point.

In this case, first guide holes H1 through which the guide bars G may pass may be formed in the upper mold 10 for first punching, and at least one second guide hole H2 through which the guide bar G may pass may be formed in the sheet body M having the first area.

Accordingly, when the guide bars G are fitted to the first guide holes H1, the movement direction of the upper mold 10 for first punching may be guided along the guide bars G, and the sheet body M having the first area may be prevented from flowing when the guide bar G is fitted to the second guide hole H2.

Accordingly, the sheet body M having the first area may be disposed to be located between the upper mold 10 for first punching and the lower mold 20 for first punching in a state in which the guide bar G is fitted to the at least one second guide hole H2, and one surface of the sheet body M may be pressurized through movement of the upper mold 10 for first punching.

Accordingly, during the first punching process, when the upper mold 10 for first punching descends, the protrusions 18 may pressurize the sheet body M having the first area, and the through parts 140 may be formed at positions corresponding to the protrusions 18 in the sheet body M having the first area through pressurization of the protrusion 18.

Further, the plurality of cracks 141 caused by a pressurizing force transferred from the protrusions 18 to form the through parts 140 may be formed at the edges of the through parts 140.

That is, when the first punching process is performed using the upper mold 10 for first punching and the lower mold 20 for first punching shown in FIGS. 19 and 20, the through part 140 having a predetermined width and length may be formed at the position corresponding to the protrusion 18 in the inner region of the sheet body M having the first area.

Figure 23:
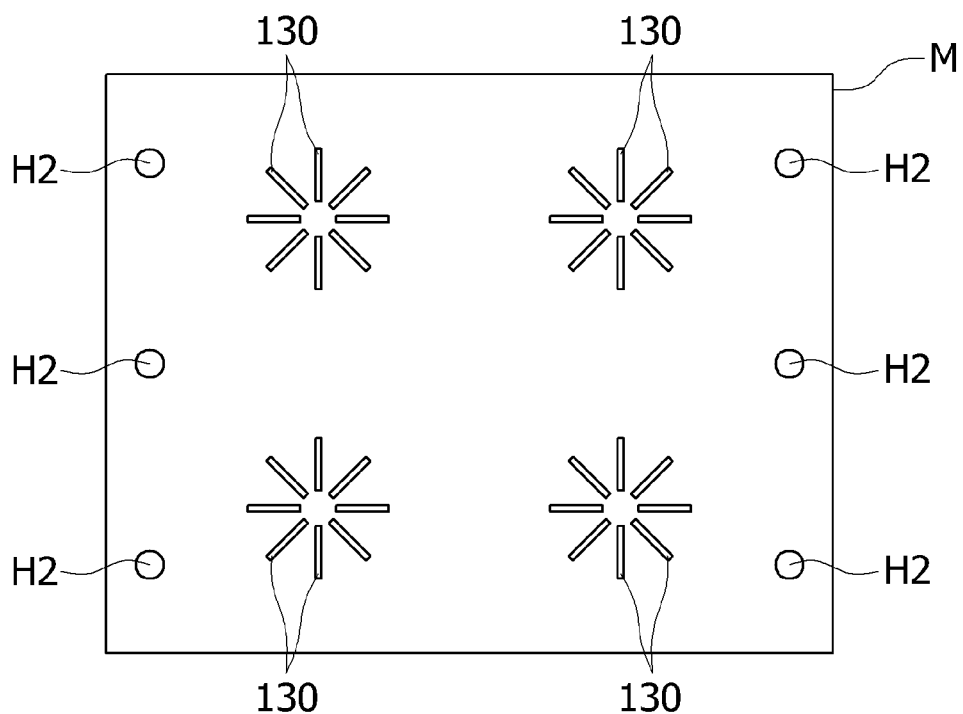
FIG. 23 is a plan view illustrating a multilayer sheet of which the first punching is completed using the mold in FIGS. 19 and 20.

In this case, the through part 140 having the shape shown in FIG. 23 may be formed in the inner region of the sheet body M having the first area according to sizes of the protrusion 18 and the opening hole 22 respectively provided in the upper mold 10 for first punching and the lower mold 20 for first punching.

Further, the cracks 141 having the shape shown in FIG. 5 may be induced and formed by the through part 140 to be formed around the through part 140 having the shape shown in FIG. 23.

Here, a cut piece separated from the sheet body M having the first area while forming the through part 140 may fall downward through the opening hole 22.

Like the above, in the method of manufacturing the magnetic shielding sheet according to one embodiment of the present invention, since the plurality of cracks 141 caused by the through part 140 may be formed in the punching process of forming the through part 140 having a predetermined width and length, the through part and the cracks caused by the through part may be locally formed only in a partial region of the total area of the shielding sheet 300 which is a final product.

Accordingly, a shielding sheet which satisfies design conditions and required specifications may be easily manufactured using the method of manufacturing the magnetic shielding sheet according to one embodiment of the present invention.

Accordingly, the shielding sheet 300 produced through the method of manufacturing the magnetic shielding sheet according to one embodiment of the present invention may realize a high permeability of 2000 or more while having a very thin thickness.

Further, the shielding sheet 300 produced through the method of manufacturing the magnetic shielding sheet according to one embodiment of the present invention may have increased overall resistance through the through parts 140 and the cracks 141 caused by the through part 140, and thus the loss by the eddy current may be reduced and transmission efficiency of the antenna may be increases by increasing the Q value.

In this case, the protrusions 18 of the upper mold 10 for first punching and the opening holes 22 of the lower mold 20 for first punching may be appropriately changed according to the shape of the through part 140 formed in the shielding sheet 300 which is a final product.

Further, although not shown in the drawings, the protrusions 18 of the upper mold 10 for first punching and the opening holes 22 of the lower mold 20 for first punching may be appropriately changed according to the shape of the through part formed in the shielding sheet 300 which is a final product. That is, the protrusions 18 of the upper mold 10 for first punching and the opening holes 22 of the lower mold 20 for first punching may be configured to correspond to the various types of through parts 140 shown in FIGS. 9 and 11.

As an example, the plurality of protrusions 18 and the plurality of opening holes 22 may be radially disposed with respect to the virtual central point, and may also be disposed to be perpendicular or parallel to a width direction or longitudinal direction of the sheet body M having the first area.

Further, each of the plurality of protrusions 18 and the plurality of opening holes 22 may be disposed to be inclined at a predetermined angle with respect to the width direction or longitudinal direction of the sheet body M having the first area, and may also be formed in an arc shape having a predetermined length.

In addition, each of the plurality of protrusions 18 and the plurality of opening holes 22 may have a shape in which at least two methods of the above-described four methods are combined with each other.

Accordingly, the various types of through parts 140 and cracks 141 shown in in FIGS. 9 and 11 may be formed in the shielding sheet 300 punched from the sheet body M having the first area through the punching process.

Meanwhile, the upper mold 10 for first punching used in the operation (S2) of firstly punching the sheet body M having the first area may be configured to remove the cut piece separated from the sheet body M having the first area in the process of forming the through parts 140 in the sheet body M having the first area from the sheet body M having the first area.

That is, in the above-described upper mold 10 for first punching, the protrusion 18 may be changed to a shape shown in FIG. 21.

Specifically, as shown in FIG. 21, the upper mold 10 for first punching may include a ring-shaped edge blade 18' formed to protrude from one surface and a separation member 19 formed to protrude inside the edge blade 18'.

Here, the separation member 19 may be formed in a planar shape having a predetermined width and length, and the separation member 19 may have a relatively smaller width and length than the width and length of the edge blade 18'. Further, the separation member 19 may be formed to protrude to a predetermined height from an inner bottom surface of the edge blade 18', and the protruding height of the separation member 19 may be the same as or relatively smaller than the height of the edge blade 18'.

In addition, the edge blade 18' may have a size corresponding to the through part 140.

Accordingly, during the first punching process, when the above-described upper mold 10 for first punching pressurizes the sheet body M having the first area, the edge blade 18' may form the through part 140 having a predetermined width and length, and the separation member 19 may pressurize the cut piece cut from the sheet body M having the first area downward through the edge blade 18' to form the through part 140.

Accordingly, the cut piece cut from the sheet body M having the first area through the edge blade 18' may be separated from the sheet body M having the first area through the separation member 19, and the cut piece separated from the sheet body M having the first area may fall downward through the opening hole 22 of the lower mold 20 for first punching.

Accordingly, the cut piece may be conveniently removed in the first punching process without individually separating the cut piece cut from the sheet body M having the first area through the edge blade 18' using the above-described upper mold 10 for first punching in the process of forming the through part 140.

Accordingly, a process of forming the through parts 140 and the cracks 141 inside the sheet body M and a process of removing an unnecessary cut piece generated in the process of forming the through parts 140 may be performed together using the above-described upper mold 10' for first punching.

Accordingly, since the entire process may be simplified using the above-described upper mold 10 for first punching even when the shielding sheet 300 including the through parts 140 and the cracks 141 is manufactured, production costs may be reduced.

The operation (S3) of secondarily punching the sheet body having the first area may be an operation of forming the shielding sheet 300 having the second area relatively smaller than the first area of the sheet body M from the sheet body M having the first area.

That is, the operation (S3) of secondarily punching the sheet body having the first area may be an operation of processing the sheet body M having the first area to the size of the shielding sheet 300 which is a final product, may be an operation of forming the outer edge L of the shielding sheet 300 having the second area from the sheet body M having the first area, and may be an operation of processing the shielding sheet 300 which is a final product so that the shielding sheet 300 may be separated from the sheet body M having the first area along the outer edge L.

In this case, the outer edge L may be formed from the sheet body M having the first area to include the through part 140 formed through the upper mold 10 for first punching.

Figure 22:
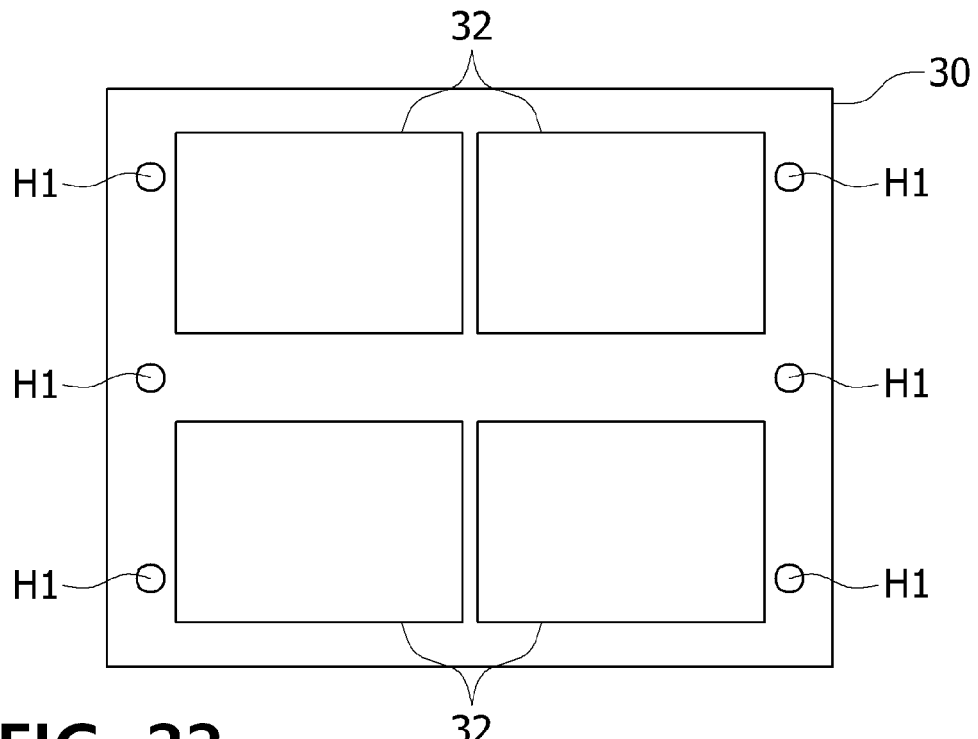
FIG. 22 is a plan view illustrating one shape of a mold usable in an operation of secondarily punching in the method of manufacturing the magnetic shielding sheet according to another embodiment of the present invention.

Specifically, the operation (S3) of secondarily punching the sheet body having the first area may be performed using a mold 30 for second molding shown in FIG. 22.

That is, the mold 30 for second molding may include at least one outer edge blade 32 formed to protrude to a predetermined height on one surface thereof, and the outer edge blade 32 may be formed in a ring shape with an empty inside.

Further, the mold 30 for second molding may include first guide holes H1 through which guide bars G pass so that movement may be guided through the guide bars G like the above-described upper mold 10 for first punching.

Figure 24:
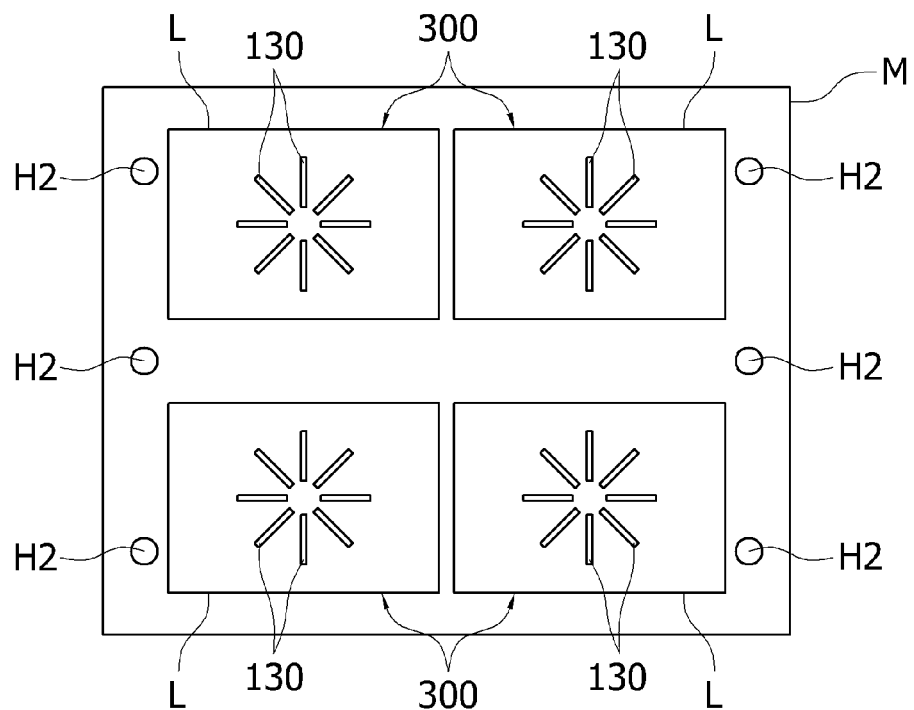
FIG. 24 is a plan view illustrating a multilayer sheet in a state in which secondary punching of the multilayer sheet in FIG. 23 is completed using the mold shown in FIG. 22.

Accordingly, when the mold 30 for second molding pressurizes the sheet body M having the first area formed with the through parts 140 and the cracks 141 caused by the through part 140, through the upper mold 10 for first punching, as shown in FIG. 24, the outer edges L which define the second area while surrounding the plurality of through parts 140 through the outer edge blade 32 may be formed in the sheet body M having the first area.

Accordingly, when a part having the second area defined through the outer edges L is separated from the sheet body M having the first area, the shielding sheet 300 which is a final product may be manufactured from the sheet body M having the first area.

In this case, in the operation (S3) of secondarily punching the sheet body having the first area, as described above, the sheet body M having the first area may include a pair of protective films 113a and 113b attached to the upper surface and the lower surface thereof through the second adhesive layers 112a and 112b, and the outer edges L formed through the mold 30 for second molding may be formed to pass through all of the sheet body M having the first area and the second adhesive layers 112a and 112b, and may not be formed in the protective film 113b attached to the lower surface of the sheet body M having the first area.

That is, as shown in FIG. 25, the outer edges L may be formed to pass through the sheet body M having the first area, the second adhesive layers 112a and 112b, and the protective film 113a attached to the upper surface of the sheet body M having the first area, and not pass through the protective film 113b attached to the lower surface of the sheet body M.

Accordingly, when a plurality of shielding sheets 300 each having the second area are formed in the sheet body M having the first area through the method of manufacturing the magnetic shielding sheet according to one embodiment of the present invention, the protective film 113b attached to the lower surface of the sheet body M having the first area may serve as a tray which maintains a state in which plurality of shielding sheets 300 each having the second area are attached to one surface.

Further, the second adhesive layer 112b may be exposed to the outside at one surface of the shielding sheet 300 having the second area separated from the sheet body M having the first area when the shielding sheet 300 having the second area is individually separated from the sheet body M having the first area.

Accordingly, a user may individually separate the shielding sheet 300 having the second area from the sheet body M having the first area, and then may attach the shielding sheet 300 to another component or attach another component to the shielding sheet 300 using the second adhesive layer 112b exposed to the outside.

However, the method of forming the outer edges L described above is not limited thereto, and the outer edges L formed in the operation (S3) of secondarily punching the sheet body having the first area may be formed so that the shielding sheets 300 may be completely separated from the sheet body M having the first area.

That is, the outer edges L formed through the mold 30 for second molding may be formed to pass through all of the sheet body M having the first area, the second adhesive layers 112a and 112b, and the pair of protective films 113a and 113*b* attached to the upper surface and the lower surface of the sheet body M having the first area.

Although embodiments of the present invention have been described above, the spirit of the present invention is not limited to the embodiments shown in the present specification, and although those skilled in the art may propose other embodiments through the addition, change, or removal of components within the scope of the same spirit of the present invention, such embodiments are also included in the scope of the present invention.

The invention claimed is:

1. A magnetic shielding sheet disposed on one surface of an antenna, the magnetic shielding sheet including a hollow part having a predetermined area at a center thereof and an eddy current-reducing pattern part surrounding the hollow part, the magnetic shielding sheet comprising:
a sheet body made of a magnetic material to shield a magnetic field; and
at least one eddy current-reducing pattern part formed in the sheet body to increase resistance of the sheet body so that occurrence of an eddy current is reduced;
wherein the antenna is a combo antenna unit in which a wireless power transmission antenna and a wireless communication antenna configured to surround a periphery of the wireless power transmission antenna are patterned on at least one surface of a circuit board; and
the at least one eddy current-reducing pattern part is located in a region corresponding to the wireless power transmission antenna without being in a region corresponding to the wireless communication antenna among a total area of the sheet body.

2. The magnetic shielding sheet of claim 1, wherein the at least one eddy current-reducing pattern part is a part of the sheet body separated into a plurality of pieces by a plurality of cracks at a position corresponding to a region where the at least one eddy current-reducing pattern part is disposed.

3. The magnetic shielding sheet of claim 2, wherein the sheet body except for the at least one eddy current-reducing pattern part among the sheet body is not formed separately into a plurality of pieces.

4. The magnetic shielding sheet of claim 2, wherein the at least one eddy current-reducing pattern part is a part in which a linear area having a predetermined width and length among the sheet body is separated into a plurality of pieces by a plurality of cracks.

5. The magnetic shielding sheet of claim 2, wherein the sheet body includes a plurality of cracks extending from an edge defining the at least one eddy current-reducing pattern part.

6. The magnetic shielding sheet of claim 2, wherein the at least one eddy current-reducing pattern part includes:
a plurality of regular cracks having a predetermined shape; and
a plurality of irregular cracks derived from the plurality of regular cracks.

7. The magnetic shielding sheet of claim 6, wherein each of the regular cracks has one cross-sectional shape among '–', '+', 'x', '*', '⊥', and '*'.

8. The magnetic shielding sheet of claim 1, wherein the at least one eddy current-reducing pattern part is a through part formed in a linear shape having a predetermined width and length to pass through the sheet body.

9. The magnetic shielding sheet of claim 8, wherein:
The at least one eddy current-reducing pattern part includes a plurality of through parts; and
the plurality of through parts are linearly disposed in one direction to form a dotted line shape to be spaced apart from each other at a predetermined interval.

10. The magnetic shielding sheet of claim 8, wherein the at least one eddy current-reducing pattern part includes a plurality of cracks extending from the through parts.

11. The magnetic shielding sheet of claim 1, wherein:
a plurality of eddy current-reducing pattern parts are in a region corresponding to the at least one eddy current-reducing pattern part; and
the plurality of eddy current-reducing pattern parts are radially disposed.

12. A method of manufacturing a magnetic shielding sheet disposed on one surface of an antenna, the magnetic shielding sheet including a hollow part having a predetermined area at a center thereof and a pattern part surrounding the hollow part, the method comprising:
a first operation of preparing a plate-shaped magnetic sheet made of a magnetic material and having a first area; and
a second operation of applying pressure to a local area of a shielding sheet so that the local area among an inner region of the shielding sheet is separated into a plurality of pieces while being separated from the magnetic sheet into a shielding sheet having a second area which is relatively smaller than the first area;
wherein the second operation is performed through a mold including a cutting blade for processing an edge of the shielding sheet, and at least one pressurizing member disposed inside the cutting blade and provided for pressurizing the local area of the magnetic sheet.

13. The method of claim 12, wherein the pressurizing member is a crack blade having a shape corresponding to a plurality of regular cracks formed in a predetermined shape on a sheet body to form the regular cracks.

14. A magnetic shielding sheet manufactured according to claim 12.

15. A method of manufacturing a magnetic shielding sheet disposed on one surface of an antenna, the magnetic shielding sheet including a hollow part having a predetermined area at a center thereof and a pattern part surrounding the hollow part, the method comprising:
a first operation of preparing a plate-shaped magnetic sheet made of a magnetic material and having a first area;
an operation of firstly punching a sheet body to form a through part having a predetermined width and length in an inner region of the sheet body and form a plurality of cracks extending from the through part; and
an operation of secondarily punching the sheet body to form a shielding sheet including the through part and having a second area which is relatively smaller than the first area,
wherein the operation of firstly punching the sheet body is performed through a mold including a ring-shaped edge blade for forming an edge of the through part and a separation member formed in an inner region of the edge blade to pressurize and separate a cut piece cut from the sheet body by the edge blade.

16. A method of manufacturing a magnetic shielding sheet disposed on one surface of an antenna, the magnetic shielding sheet including a hollow part having a predetermined area at a center thereof and a pattern part surrounding the hollow part, the method comprising:
a first operation of preparing a plate-shaped magnetic sheet made of a magnetic material and having a first area;

an operation of firstly punching a sheet body to form a through part having a predetermined width and length in an inner region of the sheet body and form a plurality of cracks extending from the through part; and an operation of secondarily punching the sheet body to form a shielding sheet including the through part and having a second area which is relatively smaller than the first area, wherein the operation of secondarily punching the sheet body is an operation of forming an outer edge defining the second area in the sheet body so that the shielding sheet is separated from the sheet body.

\* \* \* \* \*